United States Patent [19]

Barnard

[11] Patent Number: 5,604,819
[45] Date of Patent: Feb. 18, 1997

[54] DETERMINING OFFSET BETWEEN IMAGES OF AN IC

[75] Inventor: Richard D. Barnard, San Jose, Calif.

[73] Assignee: Schlumberger Technologies Inc., San Jose, Calif.

[21] Appl. No.: 31,547

[22] Filed: Mar. 15, 1993

[51] Int. Cl.$^6$ .................................................. G06K 9/00
[52] U.S. Cl. ................................. 382/151; 382/278
[58] Field of Search ............................... 382/42, 45, 8, 382/145, 151, 278, 294; 348/87, 94, 95; 356/373

[56] References Cited

U.S. PATENT DOCUMENTS

| | | | |
|---|---|---|---|
| 4,706,019 | 11/1987 | Richardson | 324/158 R |
| 4,721,909 | 1/1988 | Richardson | 324/158 R |
| 5,109,430 | 4/1992 | Nishihara et al. | 382/8 |
| 5,119,444 | 6/1992 | Nishihara | 382/8 |
| 5,140,164 | 8/1992 | Talbot et al. | 250/492.2 |

FOREIGN PATENT DOCUMENTS

| | | | |
|---|---|---|---|
| 0254643 | 1/1988 | European Pat. Off. | G06F 15/68 |
| 0381067 | 8/1990 | European Pat. Off. | G06F 15/70 |

OTHER PUBLICATIONS

A Semino et al., *Image Registration by a Region–Based Approach and by Correction of Elastic Deformations*, Signal Processing VI—Theories and Applications, Proceedings of EUSIPCO–92, Sixth European Signal Processing Conference, Brussels, Belgium, 24–27 Aug. 1992, ISBN 0–444–89587–6, 1992, Amsterdam, Netherlands, Elsevier, Netherlands, pp. 1441–1444 vol. 3.

H. Nishihara et al., *Measuring photolithographic overlay accuracy and critical dimensions by corrlating binarized Laplacian of Gaussian convolutions*, IEEE Transactions on Pattern Analysis and Machine Intelligence, Jan. 1988, USA, vol. 10, No. 1, ISSN 0162-8828, pp. 17–30.

(List continued on next page.)

*Primary Examiner*—Leo Boudreau
*Assistant Examiner*—Andrew W. Johns
*Attorney, Agent, or Firm*—Kenneth Olsen; Martin D. Hyden; Bruce D. Riter

[57] ABSTRACT

Offset between a pair of images is determined using parallel processing techniques in a general-purpose digital serial processor. For each each image, a patch of pixels is selected and convolved with a Laplacian kernel. The result is convolved with a Gaussian kernel in each of the x- and y-directions to produce a registration image. The registration images are binarized, bit-packed, and correlated to one another by performing an EXOR operation for each pixel location at each of a plurality of relative offsets of the images. The results of the EXOR operation are summed to produce an image-correlation value for each relative offset. The image-correlation indicating highest correlation determines relative offset of the images. The determined offset can be used for a variety of purposes in automating control of E-beam and FIB systems, to register images to one another or to identify a location in one image which corresponds to a selected location of the other image.

18 Claims, 22 Drawing Sheets

OTHER PUBLICATIONS

H. Nishihara, *Practical real–time imaging stereo matcher*, Optical Engineering 23(5), Sep./Oct. 1984, pp. 536–545.

H. Nishihara et al., *Measuring overlay errors and critical dimensions by correlating binarized Laplacian of Guassian convolved images*, J. Vac. Sci. Tehnol. B, vol. 6, No. 6, Nov./Dec. 1988, pp. 1925–1929.

K. Nishihara et al., *An image–matching technique for gauging and registration applications*, Proceedings of Schlumberger Software Conference, Ann Arbor, Michigan, Nov. 7–9, 1988, pp. 823–837 (unpublished Schlumberger internal document).

S. Concina et al., *Software Integration in a Workstation–based E–Beam Tester*, ITC Proceedings, 1986, pp. 644–649.

N. Richardson, *E–Beam Probing for VLSI Circuit Debug*, VLSI Systems Design, Aug. 1987.

S. Concina et al., *IDS 5000: An Integrated Diagnostic System for VLSI*, Microelectronic Engineering 7 (1987), pp. 339–342.

Schlumberger IDS 5000Plus Integrated Diagnostic System, brochure published by Schlumberger Technologies ATE, printed Mar. 1990, 6 pages.

Schlumberger IDA Integrated Diagnostic Assistant Guided Probe for ICs, brochure published by Schlumberger Technologies ATE, printed Apr. 1992, 4 pages.

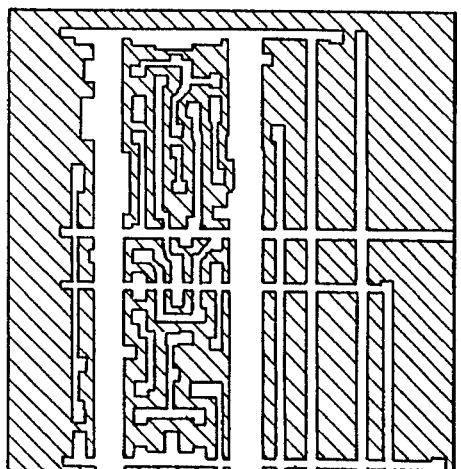
FIG. 18A  710
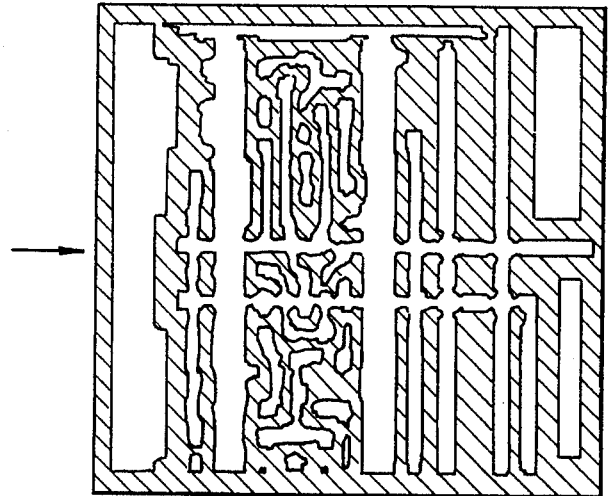
FIG. 18B  1810
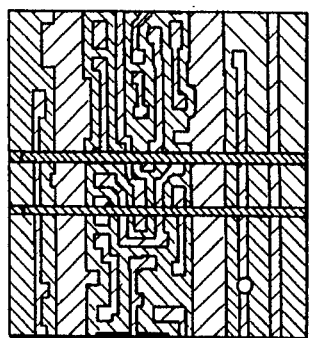
810
FIG. 19A
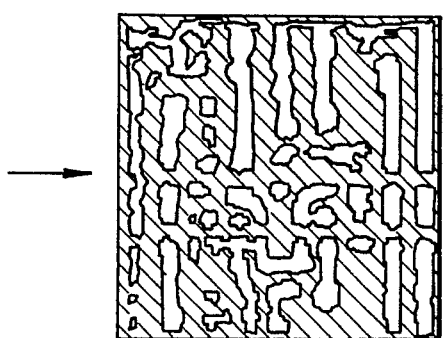
1910
FIG. 19B
| 1 | 0 | 6 | 0 | 15 | 0 | 20 | 0 | 15 | 0 | 6 | 0 | 1 |
FIG. 20

DETERMINING OFFSET BETWEEN IMAGES OF AN IC

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Field of the Invention

The present invention relates to determining offset between images such as images of an integrated circuit device, useful in automating operation of charged-particle beam systems.

2. The Prior Art

Charged-particle beam systems are commonly used in verification, characterization, design debug and modification of devices such as integrated circuits. For example, electron-beam (E-beam) systems are used to acquire and observe waveforms on internal nodes of a device as the device is exercised by application of a signal pattern to the external pins of the device, and to produce voltage-contrast images of the device. For waveform acquisition, a focused E-beam is directed at a node of the device, a signal dependent upon energy of detected secondary electrons is produced, and the signal is used to generate a waveform display. To produce a voltage-contrast image, the focused electron beam is scanned over the device, and a signal resulting from detection of secondary electrons is used to generate an image display.

Focused-ion-beam (FIB) systems are commonly used to perform three major functions: (1) etching/milling of structure, such as for cutting metal lines and drilling holes, (2) depositing material, such as for forming metal connectors and pads, and (3) scanning ion microscope (SIM) observation. These functions may be employed to modify the IC for failure analysis. For example, cutting and connecting metal lines aids in confirmation of an suspected failure mechanism or failure location, and milling holes in an insulation layer allows a "buried" conductor to be exposed or connected to a pad for improved E-beam or mechanical probing.

FIG. 1 is a block diagram showing the general structure of a prior-art charged-particle beam system. Commercially-available systems having such a structure include the "IDS 5000™" electron-beam test probe system and "IDS 7000 FIBstation™" focused-ion beam system, available commercially from Schlumberger Technologies, Inc., of San Jose, Calif. Such systems are described, for example, in U.S. Pat. Nos. 4,706,019 and 4,721,909 to N. Richardson and U.S. Pat. No. 5,140,164 to Talbot et al., the contents of which are incorporated herein by this reference.

As shown in FIG. 1, a charged-particle beam system 110 has three main functional elements: an electron-beam or FIB probe 112, a circuit exerciser 114, and a data processing system 116 which includes a display terminal 118. Data processing system 116 comprises a general purpose computer such as a Sun Microsystems workstation having a processor P with associated memory M and a data store D such as a disk drive. The circuit exerciser 114 may be a conventional integrated circuit tester, such as a model "S15™" tester (available from Schlumberger Technologies of San Jose, Calif. which can repeatedly apply a pattern of test vectors to the specimen circuit over a bus 124. The device (such as an IC) 126 is placed in a vacuum chamber 128 of probe 112. Data signifying the locations on device 126 at which the beam is to be directed are sent to probe 112 by data processing system 116 over a bus 122. Data processing system 116 may also be used to control circuit exerciser 114. System 110 can be controlled by an operator who inputs commands through display terminal 118.

As shown in FIG. 2, one such prior-art test probe 112 includes three elements mounted to a surface 225: a stage 226, a probe card 228, and a focused-beam column 229. Column 229 generates a charged-particle beam directed along axis 236. The electron beam passes through openings in surface 225 and probe card 228. The point at which the beam strikes device 126 (shown as a wafer in FIG. 2) is determined by the position of column 229 (controllable by means of an x-y stage 240) and by the deflection of the beam (controllable by means of x-y deflection coils 241).

Such systems combine on a single powerful workstation the display of a schematic circuit diagram, layout mask data and a live scanning-electron microscope (SEM) or scanning-ion microscope (SIM) image of the chip, along with analog and/or digital waveforms. The SEM (or SIM), layout and schematic displays in the prior-art Schlumberger systems are linked together to facilitate navigation around the IC chip. For example, when the user pans (moves laterally) or zooms (changes magnification) one of the linked displays, the others pan or zoom accordingly. When the user places a probe icon at a point on one of the linked displays, expected waveforms and actual measured waveforms at that point may be displayed for comparison.

The SEM (or SIM) image is related to the layout image much as an aerial view is related to a topographic or relief map of the same terrain. That is, the SEM (or SIM) image is the "aerial view" of the chip, and the layout image is the "topographic map." A qualitative difference is the causality; a topographical map is likely made from the aerial view, whereas the IC chip was manufactured according to the layout masks. The layout display is also linked to the schematic display in the aforementioned Schlumberger systems.

FIG. 3 illustrates an example of linked schematic, layout, and SEM images produced with an IDS 5000 system with the magnification set to produce a relatively wide field of view. The conventional Schlumberger systems display such images in multiple colors to provide the user with additional information such as the layer or net to which a particular displayed feature belongs. Schematic image 310 represents a portion of a circuit embodied in a device. Layout image 320 represents approximately the same portion of the circuit as is displayed in schematic image 310. SEM image 330 represents approximately the same portion of the circuit as is displayed in layout image 320. Examination of layout image 320 and SEM image 330 indicates a close correlation between the displayed circuit features. Superposed on layout image 320 and SEM image 330, respectively, are boxes representing a layout window 340 and a SEM window 350 which delimit the field of view of the probe for a given stage position at an increased level of magnification. That is, as the field of view is zoomed in and out in response to commands from the user, the displayed images zoom in and out correspondingly. Layout window 340 and SEM window 350 match each other closely once the images have been linked; that is, they represent approximately the same field of view of the circuit.

The charged-particle beam of the system can be directed at any location on the device lying within the field of view.

In a typical operation using the prior-art systems, the operator positions an icon representing the beam at a location on a schematic or layout image to indicate a location on the device at which the beam is to be directed. FIG. 4A shows a synthetic ("layout") image 400 of a portion of an integrated circuit, generated from computer-aided design data describing the integrated circuit. FIG. 4B shows a SEM image 405 of a portion of an integrated circuit. The field of view of FIG. 4A corresponds to the field of view of FIG. 4B. Shown in the synthetic image of FIG. 4A is an icon 410 representing a location of the integrated circuit at which an electron-beam is to be directed. An icon 415 marks the corresponding location in the SEM image of FIG. 4B. Referring to FIGS. 1 and 2, data processing system 116 uses the relationship between the linked schematic/layout image information to control x-y stages 226 and/or 240 and beam deflection coils 241 to direct the beam at the selected location.

Directing a focused beam at an individual device feature which may have a dimension of 1 μm or less has led to the use of high-precision x-y stages and even laser interferometers for beam positioning. Even with such equipment, accurate positioning of the beam relative to a selected device feature can be difficult and time-consuming. As geometries of circuits become smaller, keeping the CAD layout information aligned with the SEM (or SIM) image becomes more difficult. This is primarily due to errors in the stage movement and to translation errors resulting from field effects. Field effects may be global and/or local. Global field effect results in deflection of the charged-particle beam due to changing electric fields over a large area of the surface of the device being imaged, such as over a large lead frame or a large ground plane. Local field effect results in deflection of the charged-particle beam due to changing electric fields at a localized area of the device being imaged, such as when the area has latched data or is transitioning quickly between voltage levels. Such errors may demand that the system operator provide additional inputs to the system to effect fine adjustment of the beam position relative to a selected device feature after automatic positioning is completed. This need for operator intervention limits the ability to automate repetitive operations.

Methods and apparatus for registration of images are also known in the art. For example, a binocular-stereo-matching technique has been proposed for registration of a SEM image of an integrated circuit with a synthetic image generated from a database describing physical connections of the integrated circuit. The technique is influenced by Marr and Poggio's zero crossing theory, but uses the Laplacian of the Gaussian convolution sign representation with the autocorrelation function to determine disparity between two stereo images. The following steps are proposed:

Convolve grey-level images with a digital approximation of the Laplacian operator, followed by convolution with a Gaussian smoothing operator;

Binarize on the convolution of the sign;

Correlate regions of the binarized images using a pixel-wise exclusive-OR (EXOR) function over a range of possible displacement values in x and y, and report the displacement values at which the highest area correlation was measured.

This approach is described in U.S. Pat. No. 5,109,430, issued Apr. 28, 1992 to H. K. Nishihara et al. and U.S. patent application Ser. No. 07/731,378 filed Jul. 16, 1991 of H. K. Nishihara et al., and in H. NISHIHARA, Practical real-time imaging stereo matcher, OPTICAL ENGINEERING 23(5), September/October 1984, pp. 536–545, the contents of all of which are incorporated herein by this reference. The Nishihara et al. disclosures contemplate specialized image-processing hardware for implementing the technique, due to the undesirably long computation times required to accomplish image registration using general-purpose digital processors.

SUMMARY OF THE INVENTION

The present invention offers methods for rapidly determining offset between images, such as a CAD layout image of an IC device and a SEM image of the device. Offset is determined using parallel processing techniques in a general-purpose digital serial processor. The methods are reliable and tolerant of noise.

Each of a pair of images is defined by stored pixel data describing a respective plurality of pixels. Each pixel is defined by a location within an x-y grid and an intensity value. For each each image, a patch of pixels is selected and convolved with a Laplacian kernel. The result is convolved with a Gaussian kernel in each of the x- and y- directions to produce a registration image. The registration images are binarized, bit-packed, and correlated to one another by performing an EXOR operation for each pixel location at each of a plurality of relative offsets of the images. The results of the EXOR operation are summed to produce an image-correlation value for each relative offset. The image-correlation indicating highest correlation determines relative offset of the images. The determined offset can be used to register the images to one another or to identify a location in one image which corresponds to a selected location of the other image.

The methods can be used for a variety of purposes in automating control of E-beam and FIB systems, such as compensating for stage-positioning errors and field effects in positioning an E-beam probe. For example, a probe location such as an x-y coordinate is selected from a CAD layout image of an IC. A patch of the layout image including the x-y coordinate is then processed to produce a first registration image. The SEM positioning stage is moved to acquire a SEM image of the IC at a field of view including the selected coordinate. The SEM image is processed to produce a second registration image. The registration images are binarized, bit-packed and correlated to determine offset between the layout image and the SEM image. The determined offset is used to determine a corrected coordinate for placing the E-beam probe at a location on the IC corresponding to the location selected from the layout image.

Other features and uses of the invention will become apparent to those of skill in the art from the description of preferred embodiments which follows with reference to the drawing figures.

BRIEF DESCRIPTION OF THE DRAWING

FIG. 11B shows a Laplacian image resulting from convolution of the patch of

FIG. 11A with the Laplacian kernel of FIG. 9A in accordance with the invention;

FIG. 18A shows a layout image patch;

FIG. 18B shows a registration image produced by convolving the layout image patch of FIG. 18A with the Laplacian and Gaussian operators in accordance with the invention;

FIG. 19A shows a SEM image patch;

FIG. 19B shows a registration image produced by convolving the SEM image patch of FIG. 19A with the Laplacian and Gaussian operators in accordance with the invention;

FIG. 20 shows an example of coefficients for a Gaussian convolution kernel in accordance with the invention;

DESCRIPTION OF THE PREFERRED EMBODIMENTS

Preferred image registration methods in accordance with the invention will first be described with reference to a specific example involving operation of an E-beam probe system such as the Schlumberger "IDS 5000™" system. Other uses of the methods will then be described.

Figure 1:
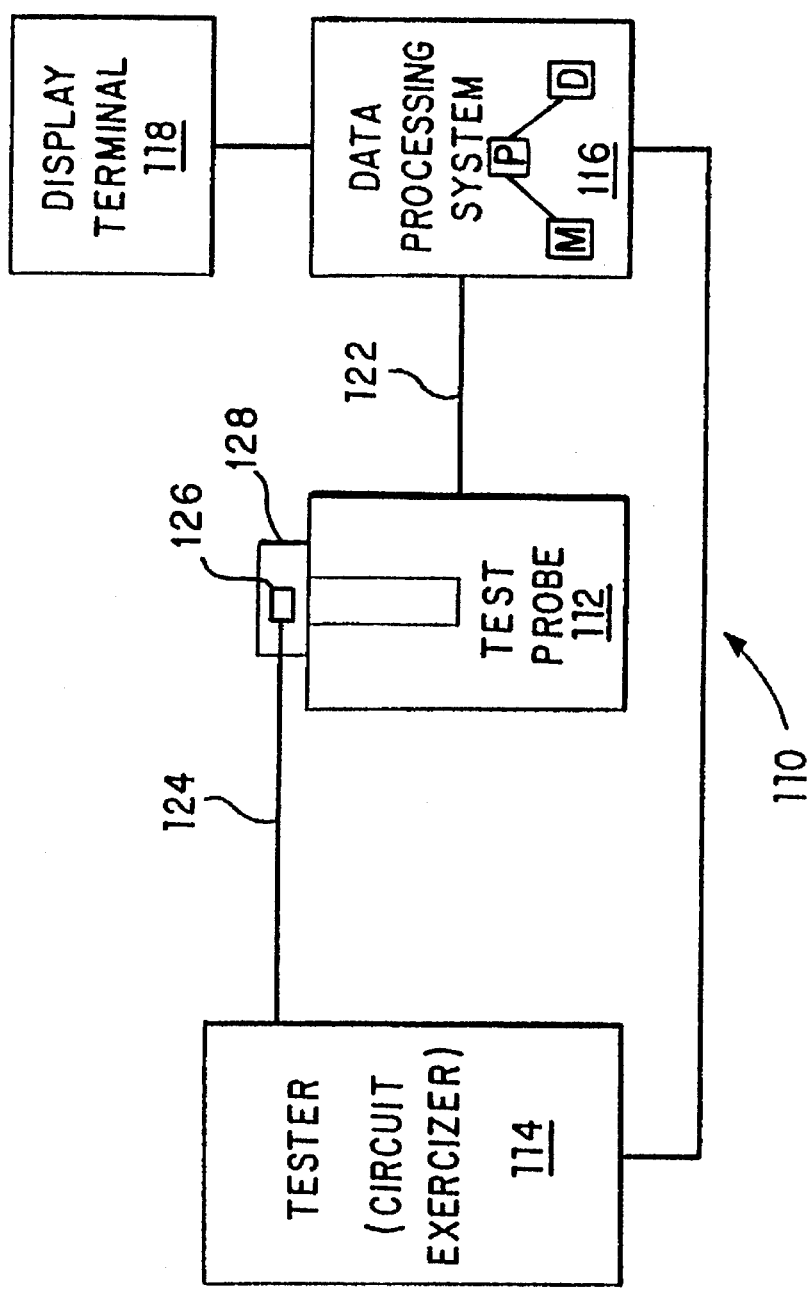
FIG. 1 is a block diagram of a prior-art charged-particle probe system.
Figure 2:
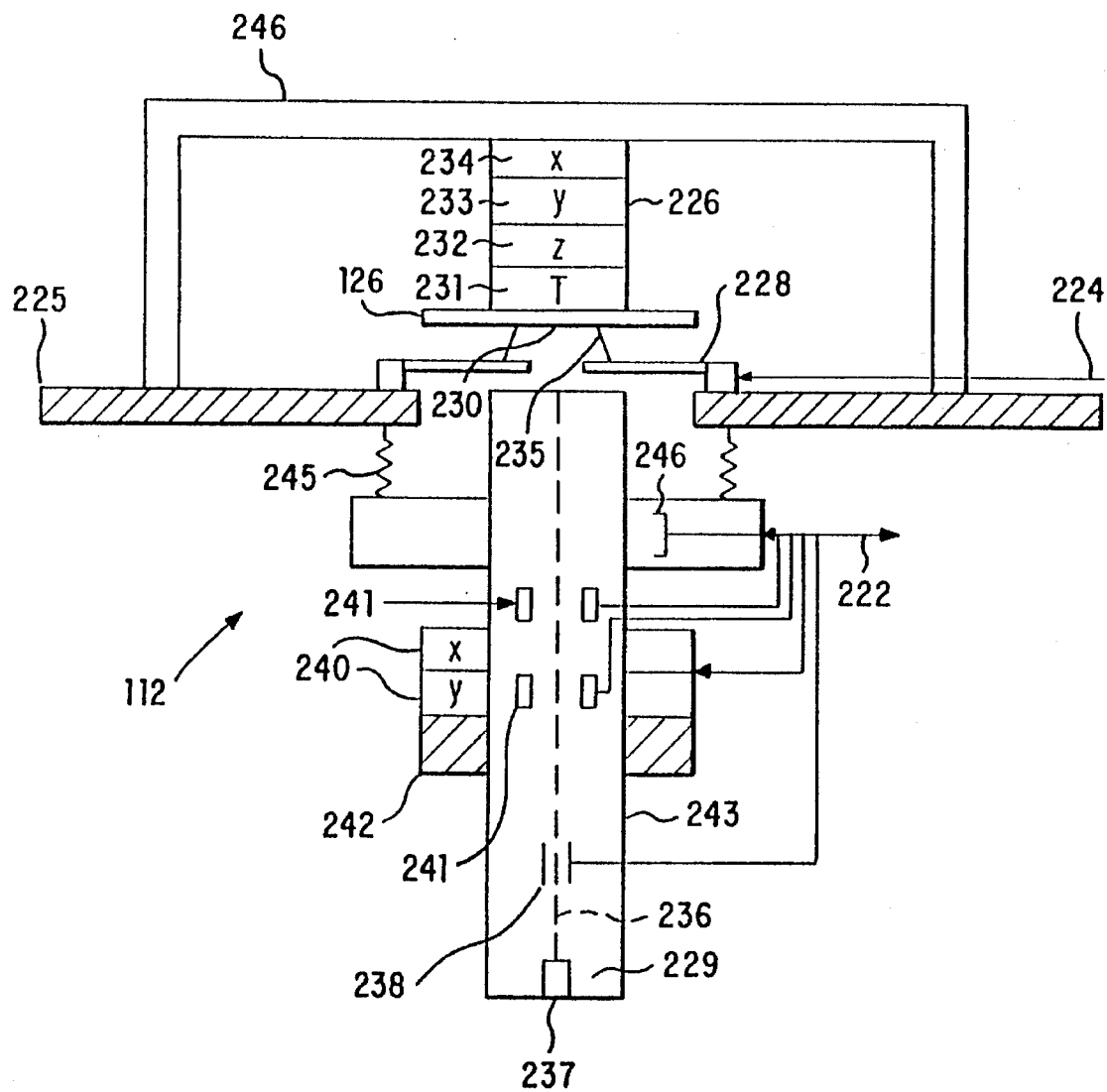
FIG. 2 illustrates a prior-art electron-beam test probe forming part of a system of the kind illustrated in FIG. 1.
Figure 3:
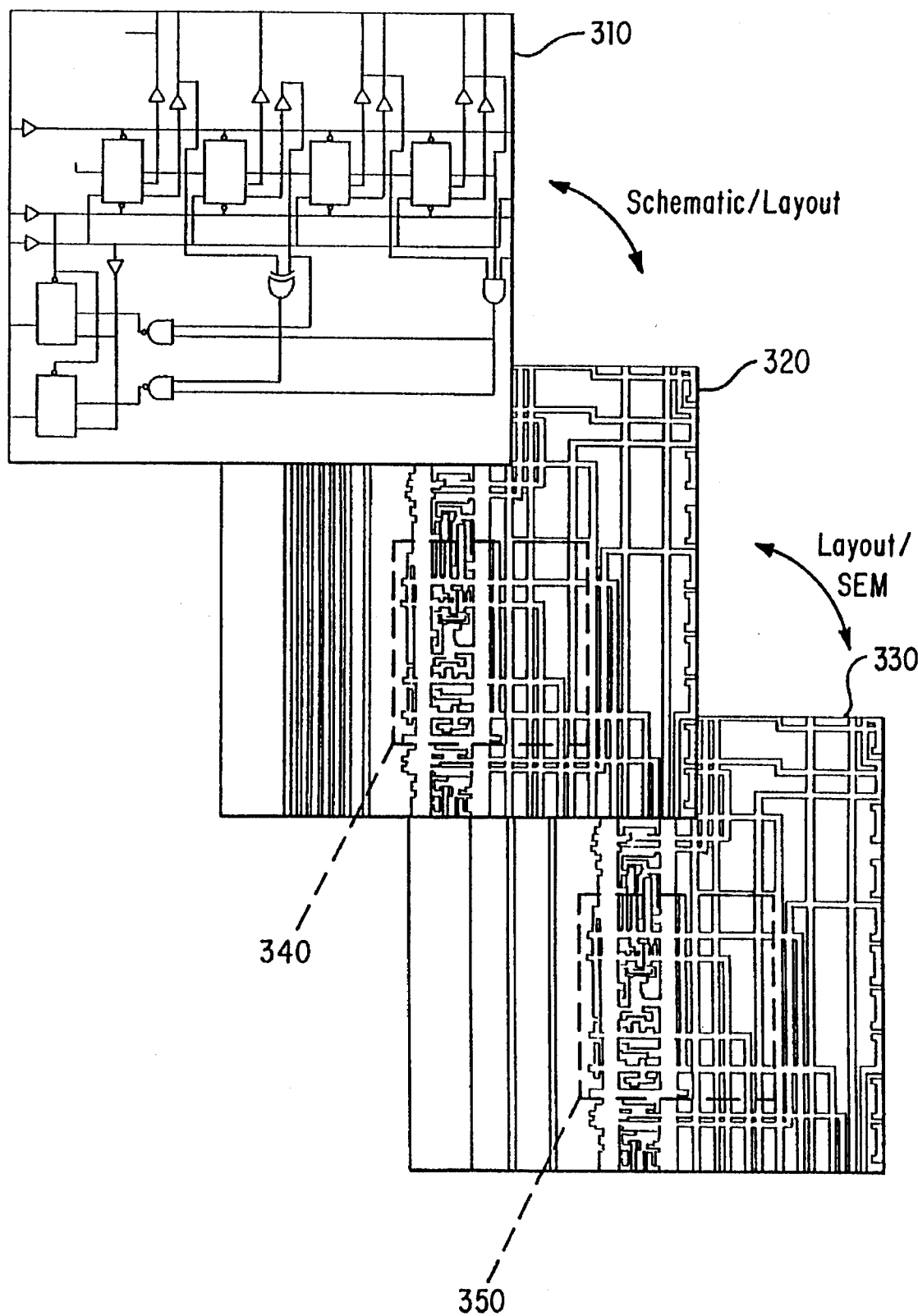
FIG. 3 illustrates an example of linked schematic, layout, and SEM images, with field-of-view windows superposed on the layout and SEM images.
Figure 4A:
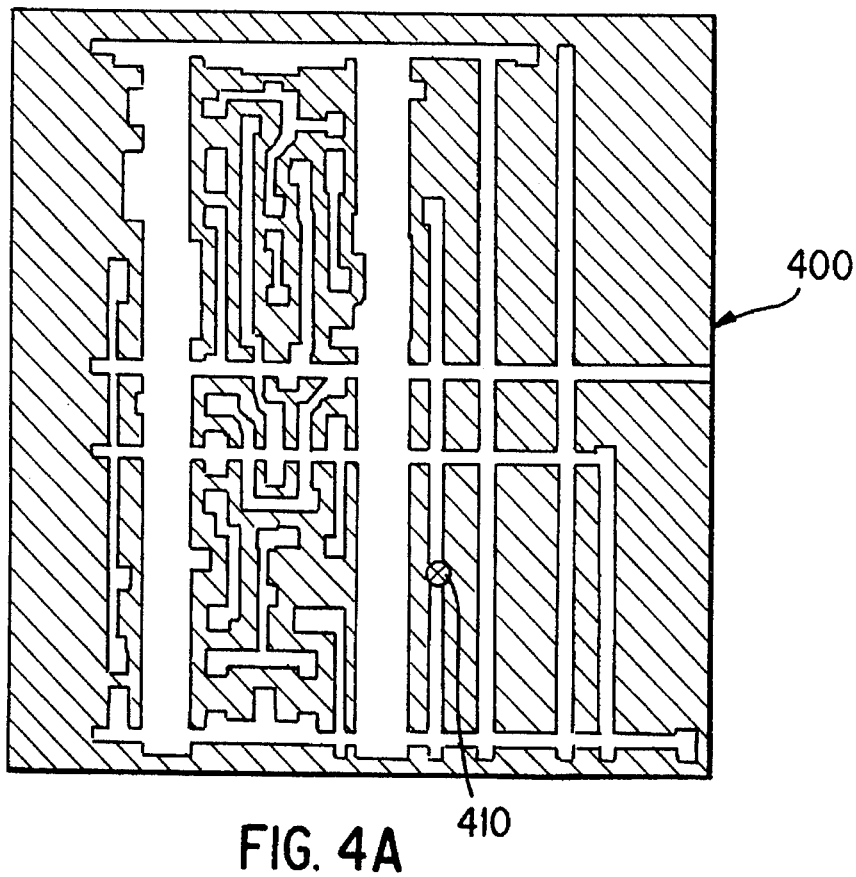
FIG. 4A shows a synthetic image of a portion of an integrated circuit, generated from computer-aided design data.
Figure 4B:
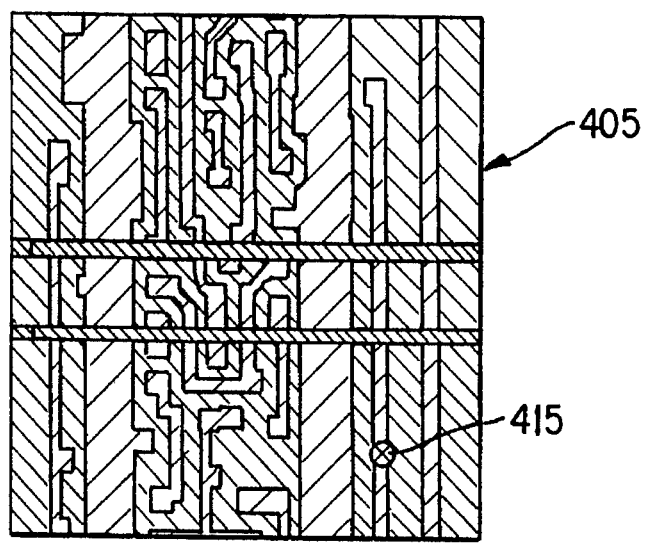
FIG. 4B shows a SEM image of a portion of an integrated circuit, corresponding to the synthetic image of FIG. 4A.

In this example, an IC is to be probed at a selected physical location with an E-beam probe. The location is selected by reference to a layout image. FIG. 4A shows such a layout image 400 and a selected location 410. The probe system uses linked layout and SEM data to determine a field of view encompassing the selected location. The field of view is set, and a SEM image is acquired encompassing the selected location, and the probe beam is positioned within the field of view. FIG. 4B shows such a SEM image and the desired probe location 415. However, the actual placement of the probe using prior-art probe systems may not coincide with the desired placement, due to stage errors, field effects, or other causes.

Figure 5:
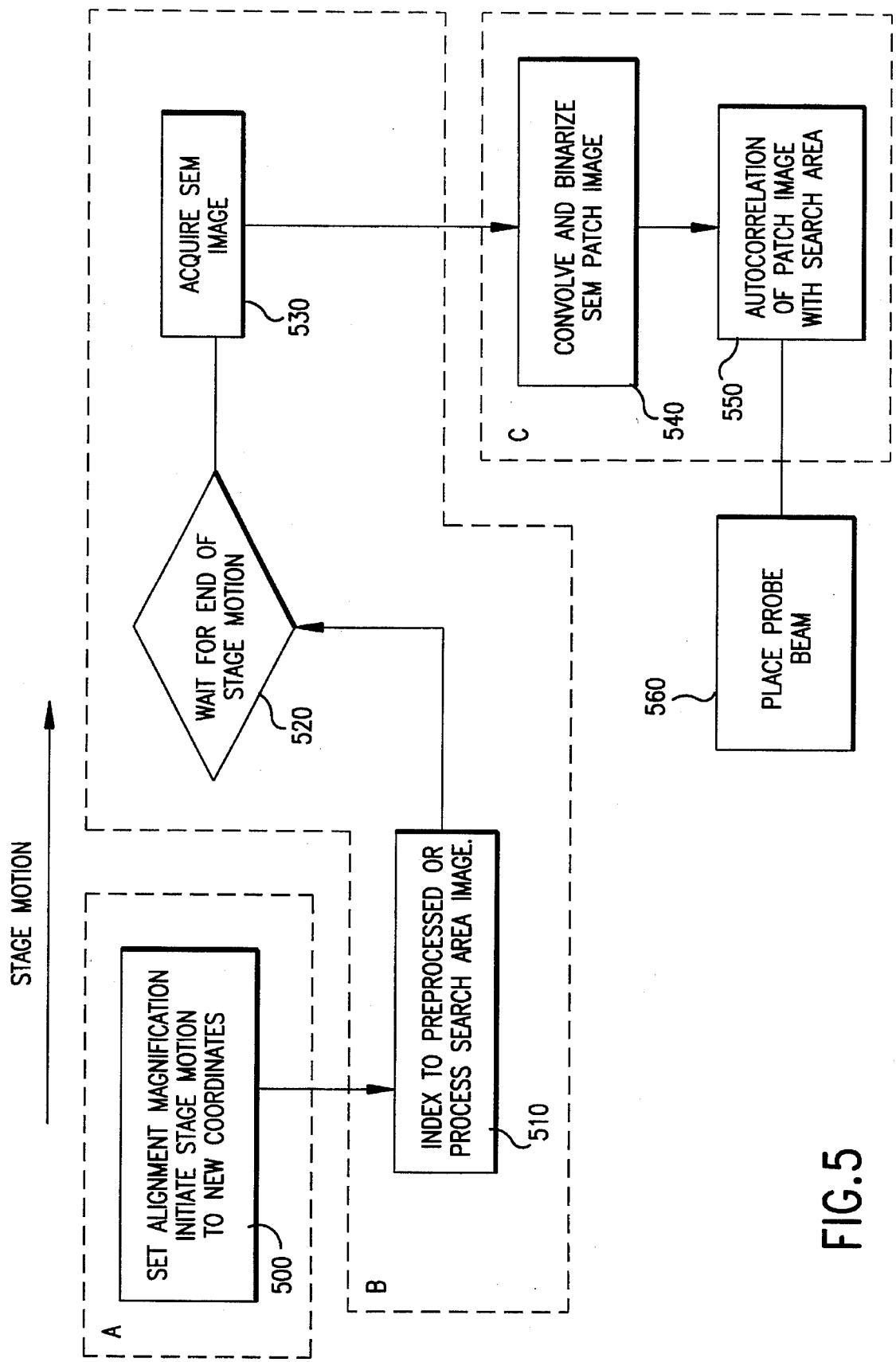
FIG. 5 is a flow diagram illustrating principal steps of a probe-placement process in accordance with the invention.

Probe placement can be corrected without human intervention by determining an offset between the layout image and the SEM image. FIG. 5 is a flow diagram illustrating principal steps of a probe beam placement process in accordance with the invention:

500. Determine and set SEM magnification and initiate stage motion to position the SEM, so that the field of view of the SEM image will encompass the location selected for probing.

510. While the stage is in motion, prepare a first registration image, such as by processing a CAD layout image or by indexing a previously-processed layout image.

520. Wait for the x-y stage to stop moving.

530. When the stage has reached the desired location, acquire a SEM image.

540. Prepare a second registration image from the newly-acquired SEM image by convolving and binarizing a patch of the SEM image.

550. Determined the offset between the first and second registration images using an autocorrelation process. The autocorrelation process determines an offset to be applied in placing the probe beam.

560. Place the probe beam, taking into account the determined offset.

Setting the Magnification

Magnification of a SEM or SIM can be controlled in a manner analogous to that of an optical microscope, by controlling magnetic fields of the beam-optical column. Magnification of the images to be registered is preferably set so as to minimize the search area for the autocorrelation and thus minimize processing time. Choosing the magnification with respect to the smallest feature size to be matched during the autocorrelation limits the search area required to compensate for stage error and field effects. This increases the speed of the autocorrelation and brings more structures into the field of view to be matched.

In the example under consideration, the purpose of determining the offset is to make it possible to accurately place the probe beam on a conductor of the IC. In general, the edge of a conductor is not considered to be a good place to probe. It is thus assumed for this example that the probe is to be placed to within one-third margin of the conductor width (i.e., not less than one-third of the width of the conductor from the edge of the conductor). Autocorrelation of the processed images will be carried out pixel-by-pixel as explained below, assuring the offset between the images will be determined to within $\pm 1$ pixel.

Figure 6:
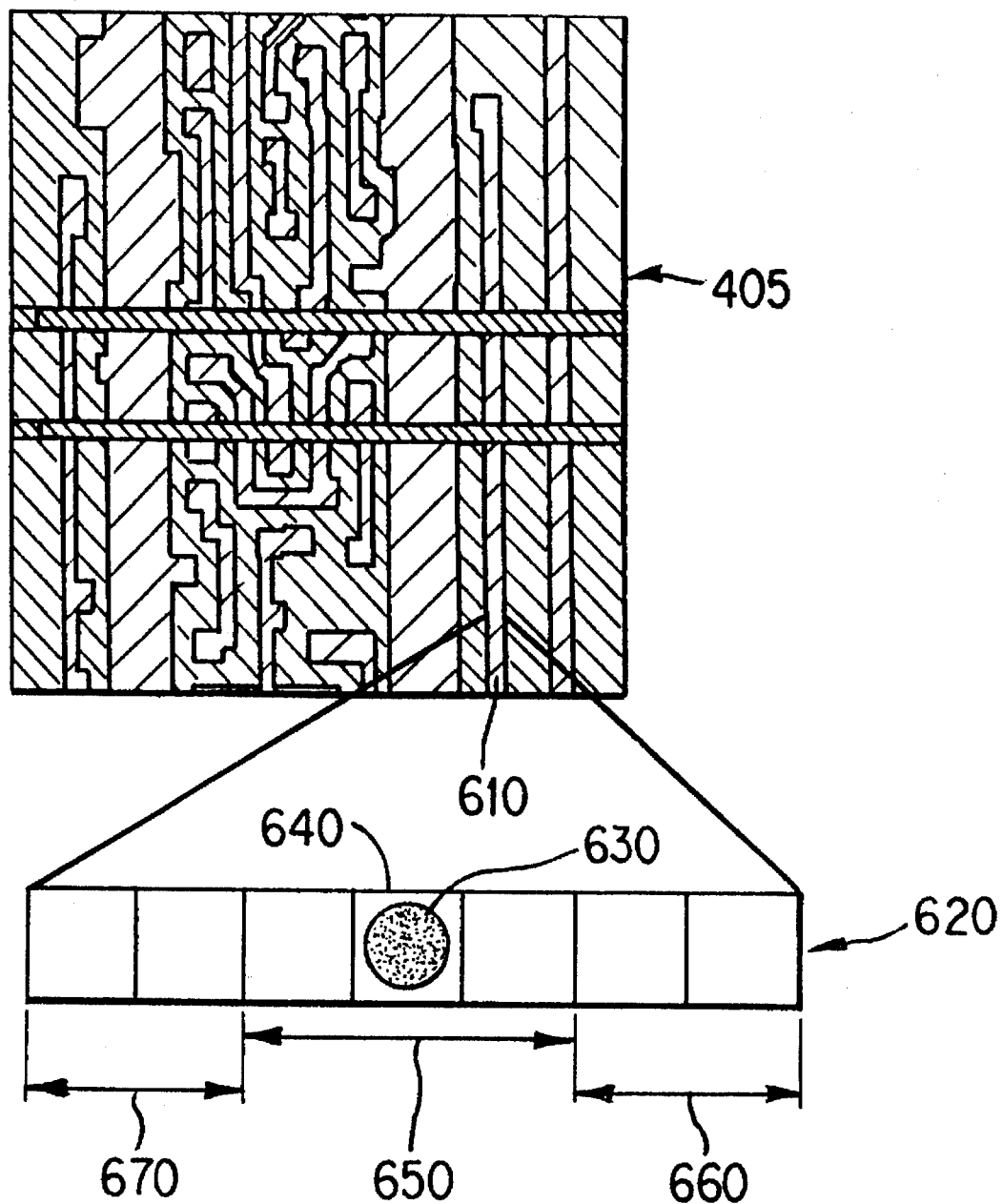
FIG. 6 shows a SEM image and illustrates desired probe beam placement relative to the conductor in accordance with the invention.

The magnification can therefore be set in this example such that the smallest feature to be matched during autocorrelation will be approximately seven pixels in width. Referring to FIG. 6, a conductor 610 within SEM image 405 is to be probed. If magnification is set such that conductor 610 is seven pixels wide in the SEM image, as shown by the band of seven pixel locations (squares) 620. It is desired to place the center of the probe beam, represented by a dot 630, at a location corresponding to the central pixel location 640. Since offset between the images is determined to within $\pm 1$ pixel, placement of the probe beam can be assured within $\pm 1$ pixel, e.g., at one of the three pixel locations shown by arrow 650 in the center section of band 620. Placing the probe beam at one of the pixel locations shown by arrow 660 or by arrow 670 is undesirable because these represent the edge of the conductor.

Selecting a "patch" From the First Image

Figure 7:
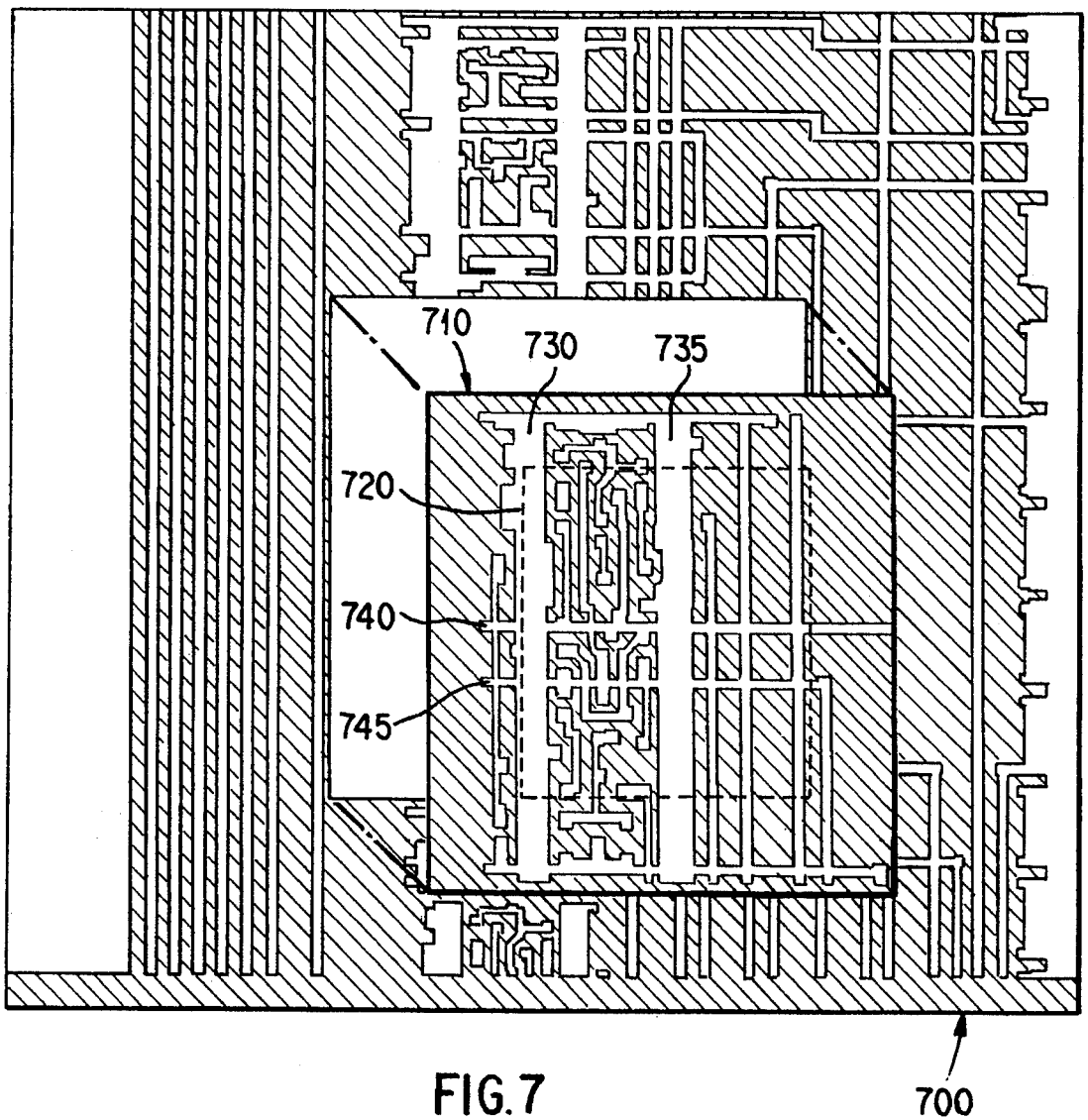
FIG. 7 shows a layout image of a portion of an integrated circuit.

While the SEM stage is in motion, a first registration image is prepared from the first image (e.g., the layout image). FIG. 7 shows a first (layout) image 700. While the entire image 700 could be processed for use in autocorrelation, it is preferred to process only a portion (a "patch" 710) of the image, to minimize processing time. The patch encompasses the selected location for probe placement location. "Patch" 710 is shown in FIG. 7 as a cut-out from image 700 for illustration purposes.

The selected x-y location to be probed lies within a region 720 outlined by dashed lines in FIG. 7. Region 720 is large enough to assure that the full width of the conductor to be probed lies within the region. For example, if magnification is set so that the smallest feature to be probed (e.g., a 1 micron-wide conductor) is 7 pixels wide, region 720 can be on the order of 100×100 pixels.

The size of patch 710 is determined from the size of region 720 and from the maximum expected offset error in each of the x- and y- directions. If the maximum expected offset error (e.g., due to stage error and field effects) is $\pm 2$ microns (where 1 micron is represented by 7 pixels), then it is sufficient if patch 720 is larger than region 710 in each of the x- and y-directions by an amount equal to twice the maximum expected offset error (e.g., 2×2 microns, or 28 pixels). Thus, if region 720 is represented by 100×100 pixels and the maximum expected offset error is represented by 14 pixels, then patch 710 can have a dimension of 128×128 pixels.

The first registration image is prepared by processing the pixels of patch 710 as described below. The first registration image will be used as a "search area" during autocorrelation.

Selecting a "Patch" From the Second Image

Figure 8:
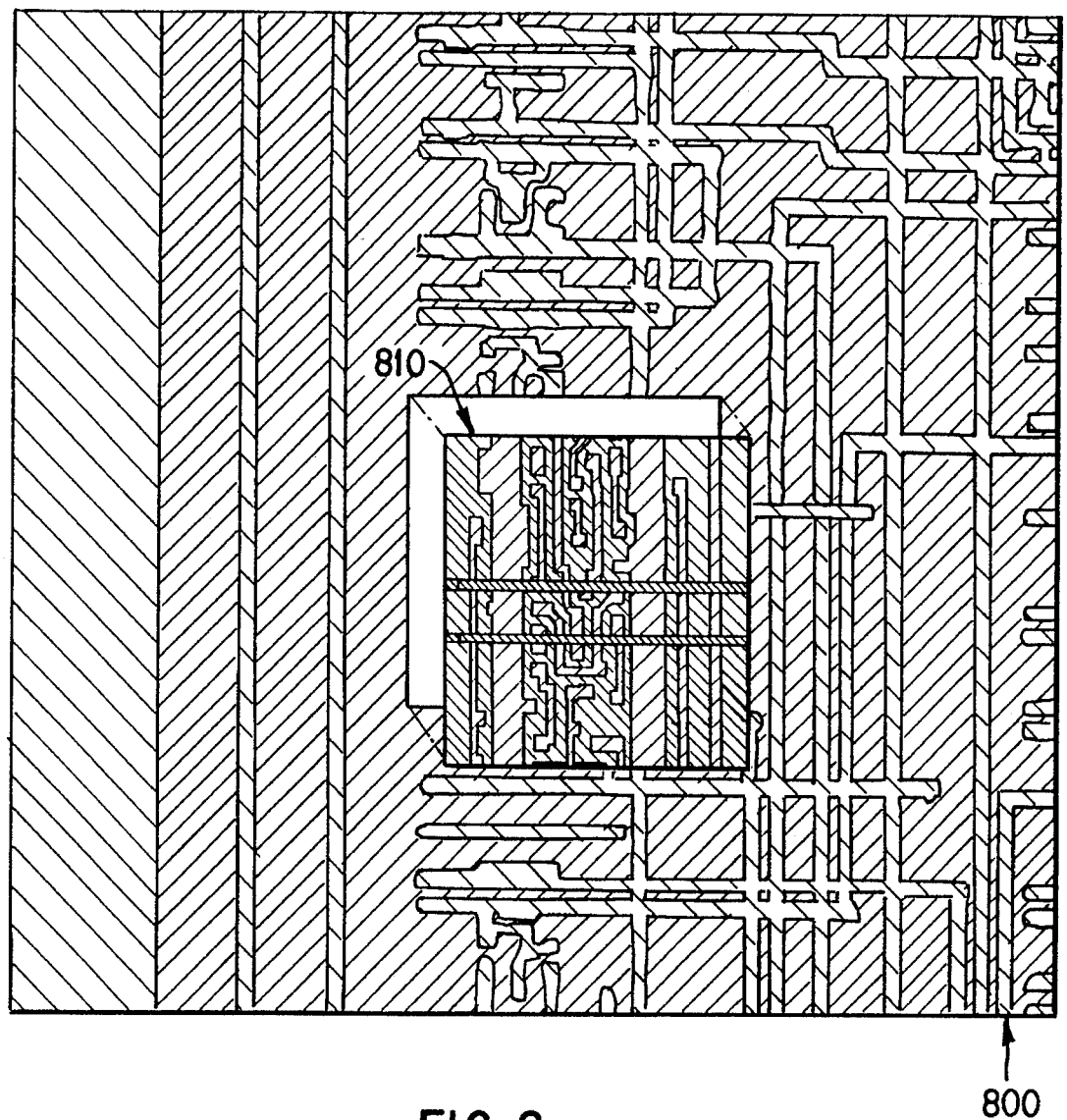
FIG. 8 shows a SEM image of a portion of an integrated circuit.

When the stage motion is completed, a second (e.g., SEM) image is acquired at the new stage position. FIG. 8 shows such a SEM image 800. The field of view of SEM image 800 is determined by the magnification set as described above. A "patch" 810 of SEM image, shown cut-out for illustration purposes, is selected for processing. The size of patch 810 is preferably about that of region 720 in FIG. 7. The x-y coordinate position selected for probing lies within patch 810. Because the offset (e.g., due to stage-positioning and field-effect errors) between the respective coordinate systems of the linked layout image and the SEM image is thus far unknown, the selected x-y coordinate position may not coincide on the SEM image with the feature to be probed.

Patch 810 is processed as described below to prepare a second registration image used in carrying out the autocorrelation, as described below. While the entire SEM image could be processed, processing only a patch reduces the time to create the second registration image and to perform the autocorrelation. Reliability of the autocorrelation result generally increases with the size of the registration images, though large patch sizes bring in not only more surface topology to be matched but also more noise. Selection of patch sizes is thus a balance between processing time and reliability. In the example described, a patch 810 of 100×100 pixels is selected as a balance between processing time and autocorrelation reliability. Larger patch sizes, e.g., 128×128 or 256×256, have also been used successfully. For some applications, such as precise FIB operations, it may be desirable to select a high magnification a relatively large patch size.

Preparing Registration Images

The first and second image patches (e.g., 710 and 810) are processed to produce the first and second registration images. This is done in accordance with the invention by performing a Laplacian convolution followed by Gaussian smoothing.

Figure 9B:
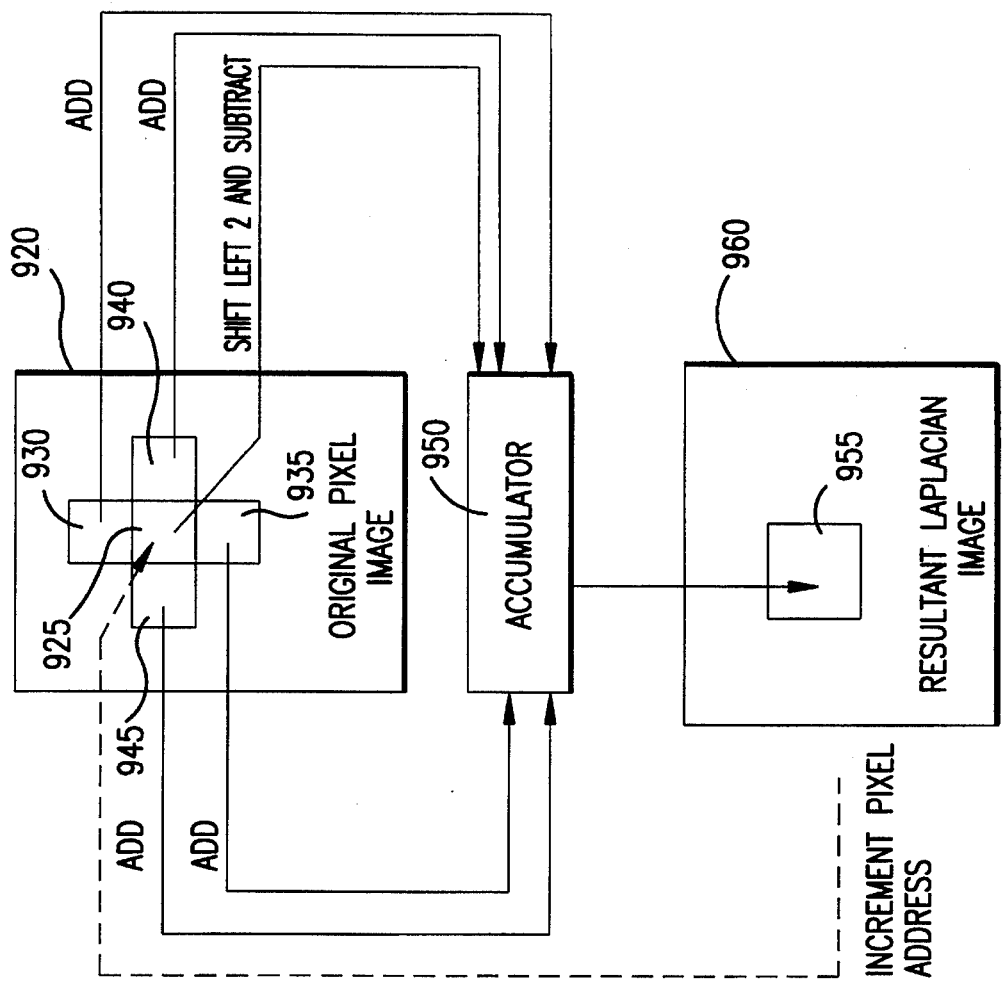
FIG. 9B shows a method in accordance with the invention of convolving an image with a Laplacian kernel.
Figure 9A:
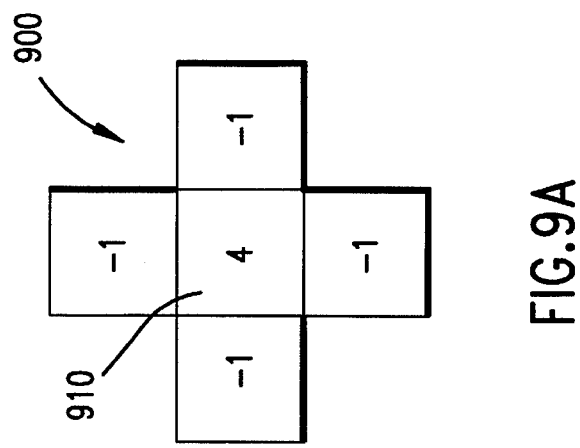
FIG. 9A shows preferred kernel coefficients for Laplacian convolution in accordance with the invention.

FIG. 9A shows preferred coefficients of a Laplacian kernel 900 for the Laplacian convolution. Advantages of the Laplacian convolution include independence of absolute brightness, and a zero-mean resultant image which helps to prevent integer overflow in carrying out the Gaussian convolution.

Figure 10A:
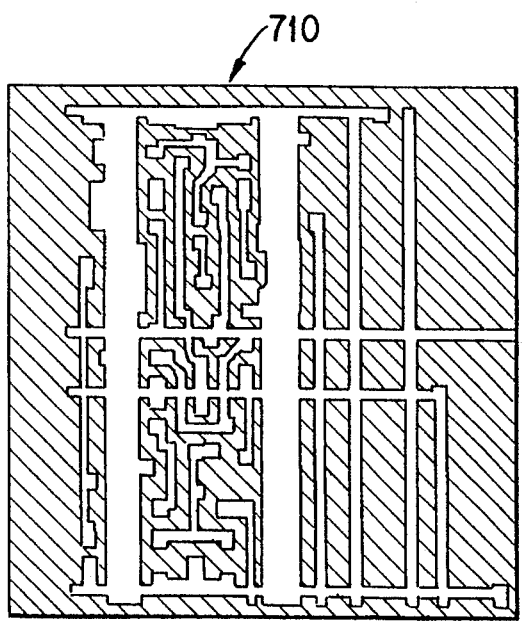
FIG. 10A shows a patch of the layout image of FIG. 7.
Figure 10B:
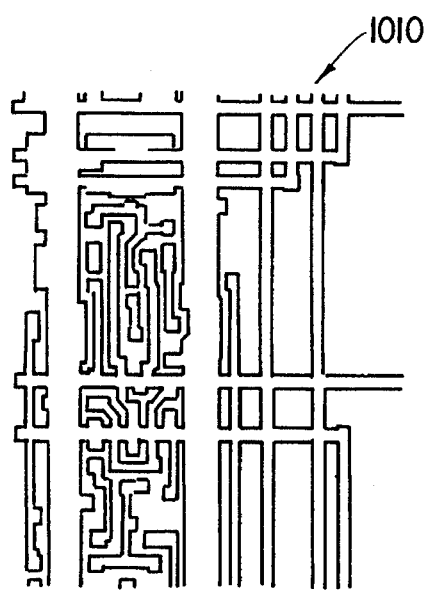
FIG. 10B shows a Laplacian image resulting from convolution of the patch of FIG. 10A with the Laplacian kernel of FIG. 9A in accordance with the invention.

FIG. 10A again shows layout patch 710. FIG. 10B shows a Laplacian image patch 1010 resulting from convolution of patch 710 with the Laplacian kernel of FIG. 9A. Comparison of FIGS. 10A and 10B reveals that the Laplacian convolution detects "edges" in the image pattern.

Figure 11A:
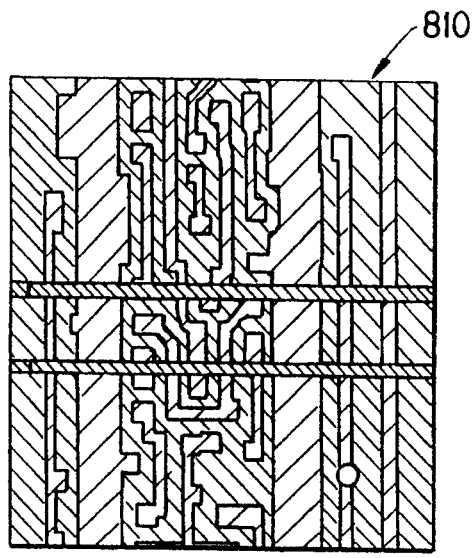
FIG. 11A shows patch of the SEM image of FIG. 8.
Figure 11B:
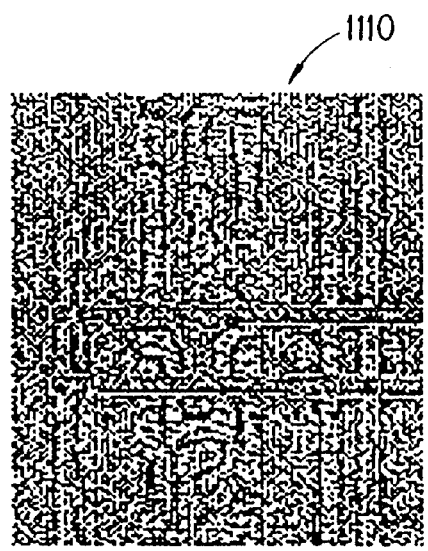

FIG. 11A again shows SEM image patch 810. FIG. 11B shows a Laplacian image patch 1110 resulting from convolution of patch 810 with the Laplacian kernel of FIG. 9A. Comparison of FIGS. 11A and 11B reveals that application of the Laplacian to a SEM image emphasizes noise in the SEM image. This noise will be smoothed by Gaussian convolution. Gaussian convolution provides tolerance of images having low contrast, noisy background, damaged patterns and background defects. Width of the Gaussian convolution kernel allows control over the size of features to be correlated.

The Laplacian convolution is implemented in a tight, single-pass processing loop. Referring to FIG. 9A, the intensity value of a pixel of the original image patch is multiplied by the center kernel coefficient 910 (having a value of 4). Each north, south, east, west neighboring pixel is multiplied by the corresponding kernel coefficient (having a value of −1). The sum of the products is taken as the intensity value for a pixel of the Laplacian patch at an x-y location corresponding to the x-y location of the pixel of the original image patch. The process is repeated for each pixel of the original image patch to produce the Laplacian patch.

In practice, the original image patch preferably resides in memory and shift operations are used instead of multiplication. Offsets to the neighbor pixels are predetermined. Data and address registers of the microprocessor are used to optimize performance. FIG. 9B illustrates an exemplary method in accordance with the invention of convolving an image with a Laplacian kernel. The pixel intensity values of the image patch to be convolved are stored in a memory 920. For a given pixel location 925 in memory, the neighboring pixel intensity values at 930, 935, 940 and 945 (to the north, south, east and west, respectively) are summed in an accumulator 950, and the pixel intensity value at location 925 is shifted left two places and subtracted from the sum in the accumulator. The resulting value in the accumulator is then stored in a location 955 in a memory 960. The value stored at location 950 is taken as the intensity value of a pixel of the resultant Laplacian image. The pixel address is then incremented, and the process repeated.

Figure 12:
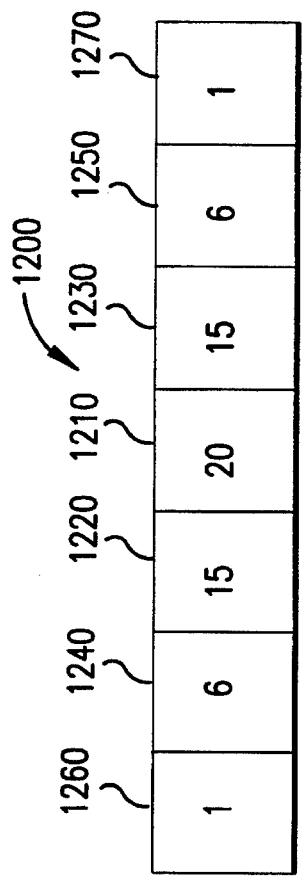
FIG. 12 shows an example of coefficients for a Gaussian convolution kernel in accordance with the invention.

FIG. 12 shows coefficients of a preferred Gaussian convolution kernel 1200. The Laplacian patch is to be convolved with kernel 1200 in each of the x- and y-directions to produce a registration image. Conceptually, the intensity value for a given pixel location of the registration image is to be determined as follows. The intensity value of a pixel at the corresponding location of the Laplacian patch is multiplied by the center coefficient 1210 (having a value of 20). The intensity value of the neighboring pixel of the Laplacian patch in each of the north, south, east and west directions is multiplied by the next adjacent coefficient 1220, 1230, etc. (having a value of 15). The intensity value of the next nearest pixel of the Laplacian patch in each of the north, south, east and west directions is multiplied by the next respective coefficient 1240, 1250, etc. (having a value of 6). The intensity value of the next nearest pixel of the Laplacian patch in each of the north, south, east and west directions is multiplied by the next respective coefficient 1260, 1270, etc. (having a value of 1). The sum of the products is taken as the intensity value for the given pixel location of the registration image. The intensity value for each pixel location of the registration image can be determined in this manner.

However, the present invention offers more efficient methods of achieving the same result. The Gaussian convolution is carried out for each pixel location as two one-dimensional convolutions (e.g., a convolution in the x-direction followed by a convolution in the y-direction) to minimize computational effort. This approximates a circular Gaussian smoothing function. Each of the one-dimensional convolutions is broken down into two further steps designed to reduce the number of math operations.

Figure 13:
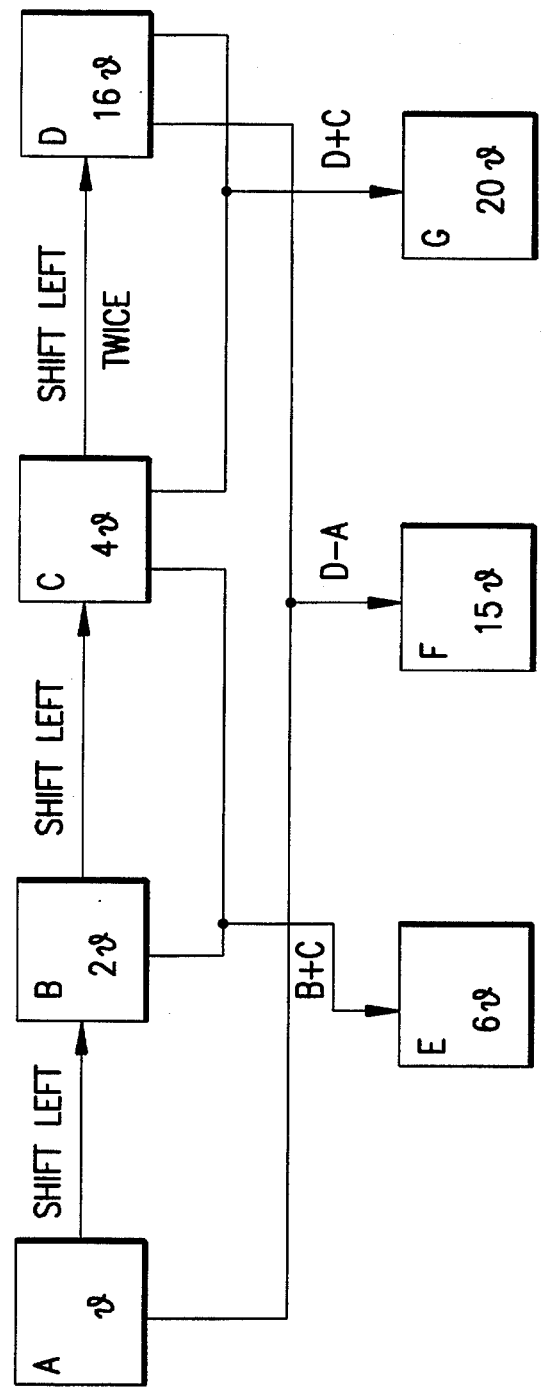
FIG. 13 shows shift and add operations for factoring and creating multiplier images in performing Gaussian convolution in accordance with the invention.
Figure 14:
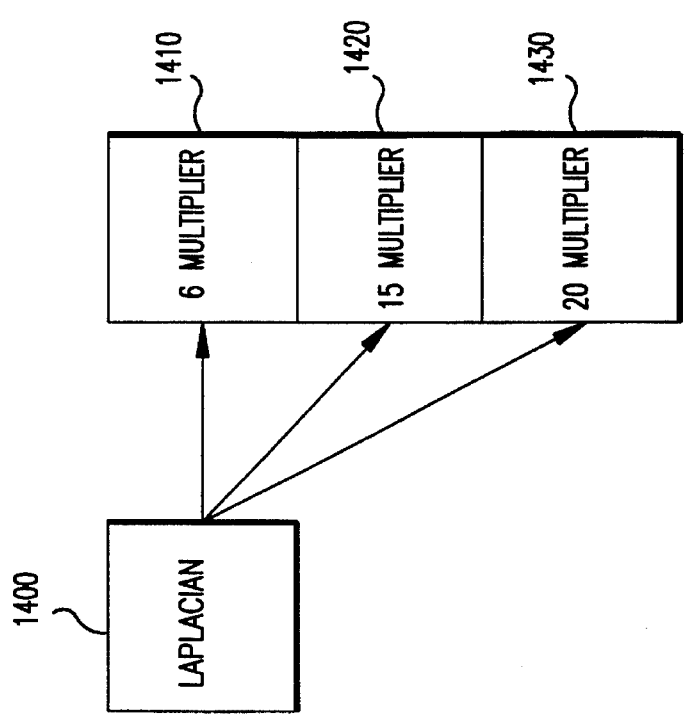
FIG. 14 illustrates the first step of the x-axis Gaussian convolution in accordance with the invention.

FIGS. 13 and 14 illustrate the first step of the x-axis Gaussian convolution. Referring to FIG. 14, zero-mean Laplacian image 1400 is used to create multiplier images 1410, 1420 and 1430, each of these multiplier images representing the Laplacian image multiplied by a respective one of the Gaussian kernel coefficients, 6, 15 and 20. Laplacian image 1400 can be taken as a multiplier image representing Laplacian image 1400 multiplied by Gaussian kernel coefficient 1.

In preparing the multiplier images, repetitive multiplication operations are avoided by bit-shifting pixel intensity values and factoring the Gaussian kernel values. Referring to FIG. 13, the intensity value of a pixel is effectively multiplied by each of the Gaussian kernel coefficients through a series of shift, addition, and subtraction operations. The intensity value of a pixel of Laplacian image 1400 is stored as a binary value $\vartheta$ in a register A. The stored value is left-shifted one place, resulting in a multiplication by 2, and stored in a register B as a binary value 2 $\vartheta$. The value stored in register B is left-shifted one place, resulting in a multiplication by 2, and stored in a register C as a binary value 4 $\vartheta$. The value stored in register C is left-shifted two places, resulting in a multiplication by 4, and stored in a register D as a binary value 16 $\vartheta$. The values stored in registers B and C are added and stored in a hardware register E as a binary value 6 $\vartheta$. The value 2 $\vartheta$ stored in register A is subtracted from the value 16 $\vartheta$ stored in register D and the resulting value 15 $\vartheta$ is stored in a hardware register F. The values stored in hardware registers C and D are added and stored as a binary value 20 $\vartheta$ in a hardware register G. Registers A, E, F and G contain the intensity value $\vartheta$ of the Laplacian image pixel multiplied respectively by the Gaussian kernel values 1, 6, 15 and 20. The process is repeated for each pixel of the Laplacian image to produce a multiplier image for each value of the Gaussian kernel.

Figure 15:
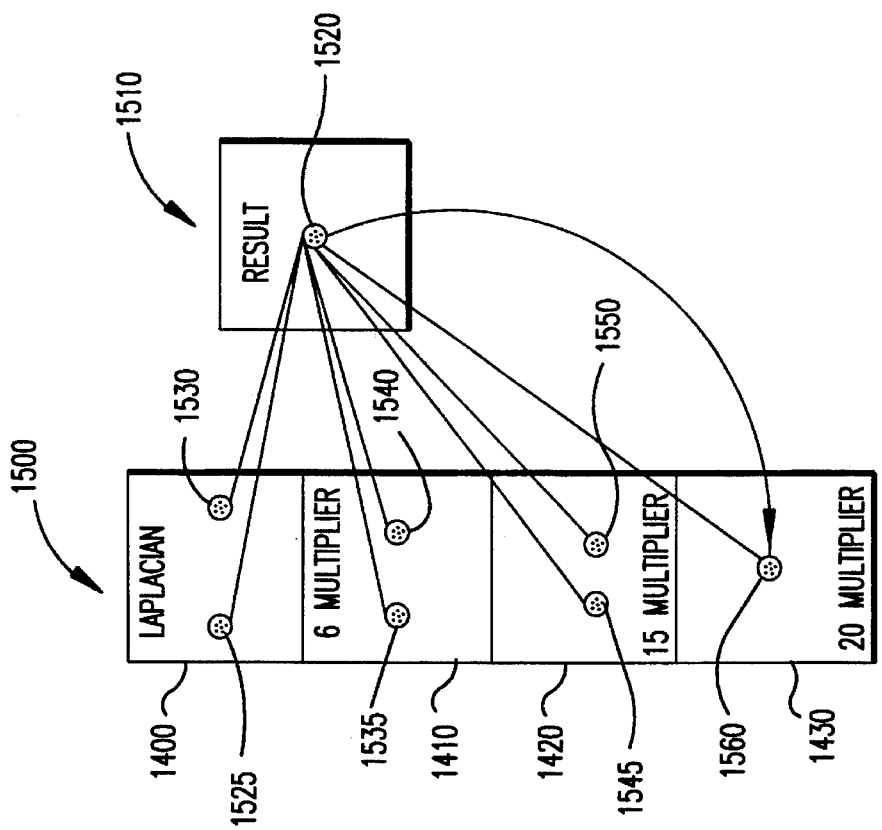
FIG. 15 illustrates the second step of the x-axis Gaussian convolution in accordance with the invention.

Referring to FIG. 15, the multiplier images (1400, 1410, 1420 and 1430) can be stored as a single data structure 1500 to minimize the number of registers required for storage. Offsets into the structure point to the beginning of each separately multiplied image. Data structure 1500 comprises the pixel intensity values of the Laplacian image (1400), the pixel values of the Laplacian image multiplied by 6 (1410), the pixel values of the Laplacian image multiplied by 15 (1420), and the pixel values of the Laplacian image multiplied by 20 (1430).

The second step of the x-axis Gaussian convolution is also illustrated in FIG. 15. The intensity value for each pixel of a resultant image 1510 is derived by adding together selected pixel intensity values from data structure 1500. That is, the intensity value for a given pixel location 1520 of the resultant image is determined by adding together:

the values of two pixels 1525 and 1530 from the one-multiplier Laplacian image 1400, the locations of pixels 1525 and 1530 being offset in the x-direction by three pixel locations from the pixel location of Laplacian image 1400 which corresponds to pixel location 1520, and the values of two pixels 1535 and 1540 from the six-multiplier image 1410, the locations of pixels 1535 and 1540 being offset in the x-direction by two pixel locations from the pixel location of the 6-multiplier image 1410 which corresponds to pixel location 1520, and the values of two pixels 1545 and 1550 from the fifteen-multiplier image 1420, the locations of pixels 1545 and 1550 being offset in the x-direction by one pixel location from the pixel location of the 15-multiplier image 1420 which corresponds to pixel location 1520, and the value of a pixel 1560 from the twenty-multiplier image 1430, the location of pixel 1560 corresponding to pixel location 1520.

The sums are completed to produce an intensity value for each pixel location of resultant image 1510, so that resultant image 1510 represents the convolution of Laplacian image 1400 with Gaussian kernel 1200 in the x-direction.

Figure 17:
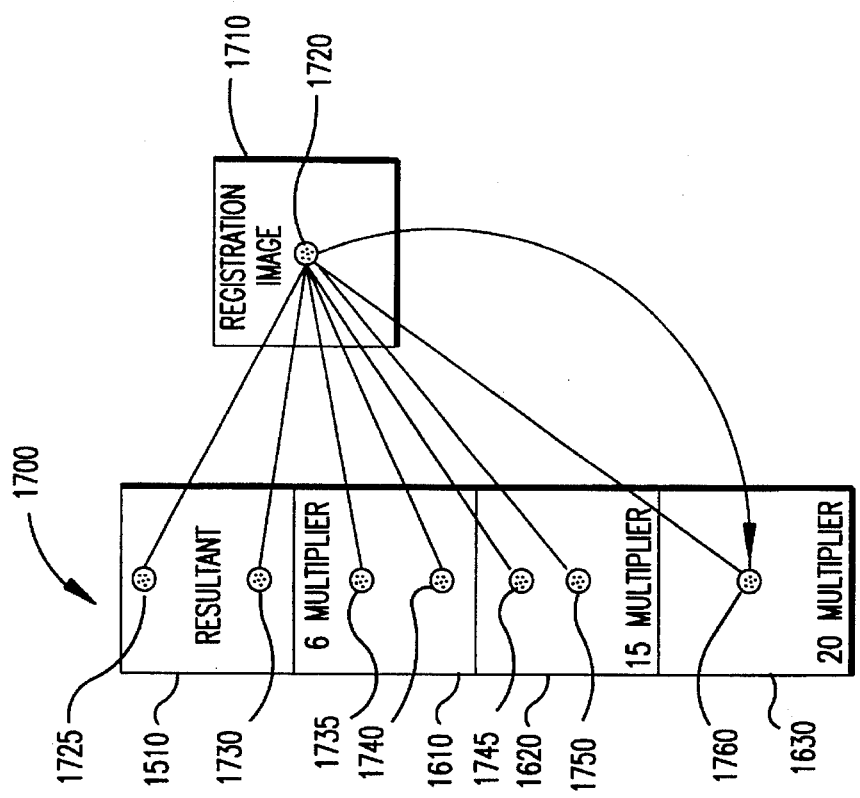
FIG. 17 illustrates the second step of the y-axis Gaussian convolution in accordance with the invention.
Figure 16:
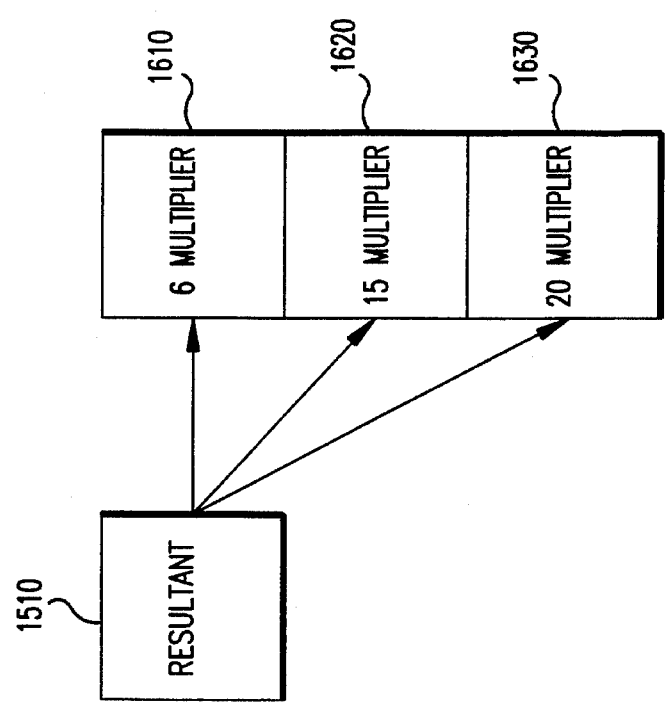
FIG. 16 illustrates the first step of the y-axis Gaussian convolution in accordance with the invention.
Figure 21A:
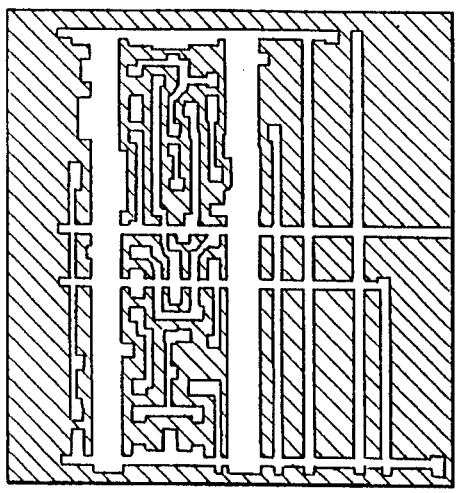
FIG. 21 shows a series of images juxtaposed to illustrate the autocorrelation objective of the invention, in which (a) is a CAD layout image patch, (b) is a registration image prepared from the layout image patch in accordance with the invention, (c) is a SEM image patch, (d) is a registration image prepared from the SEM image patch in accordance with the invention, (e) and (g) are portions of the layout image patch, (f) is an overlay of the SEM registration image and the layout registration image, and (h) is an overlay of the SEM registration image and the layout registration image with mismatching pixels shown in black and matching pixels shown in white.
Figure 21B:
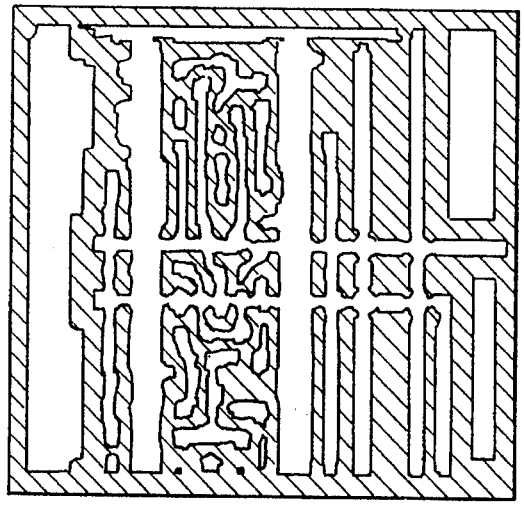
Figure 21C:
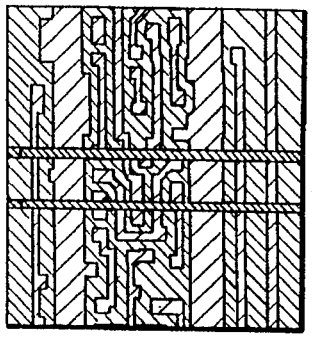
Figure 21D:
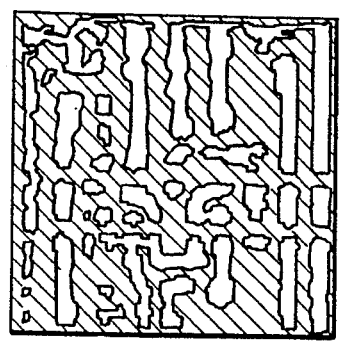
Figure 21E:
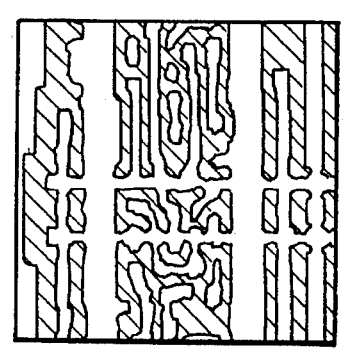
Figure 21F:
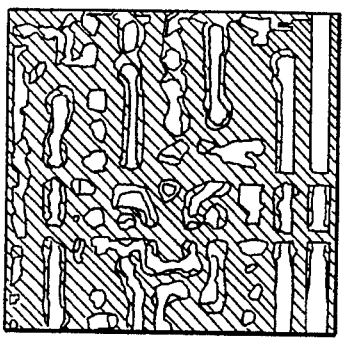
Figure 21G:
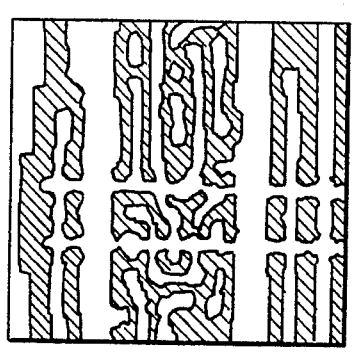
Figure 21H:
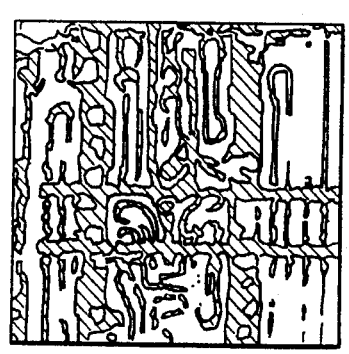

FIGS. 13 and 16 illustrate the first step of the y-axis Gaussian convolution. Referring to FIG. 16, resultant image 1510 is used to create multiplier images 1610, 1620 and 1630, each of these multiplier images representing the resultant image multiplied by a respective one of the Gaussian kernel coefficients, 6, 15 and 20. Resultant image 1510 can be taken as a multiplier image representing resultant image 1510 multiplied by Gaussian kernel coefficient 1. The multiplier images are prepared using the method described with reference to FIG. 13 (except that this time the pixels of the resultant image are processed rather than pixels of the Laplacian image). These multiplier images (1510, 1610, 1620 and 1630) can be stored as a single data structure, to minimize the number of registers required for storage. Offsets into the structure point to the beginning of each separately multiplied image. As shown in FIG. 17, data structure 1700 comprises the pixel values of the resultant image multiplied by 1 (1510), the pixel values of the resultant image multiplied by 6 (1610), the pixel values of the resultant image multiplied by 15 (1620), and the pixel values of the resultant image multiplied by 20 (1630).

The second step of the y-axis Gaussian convolution is similar to the second step of the x-axis Gaussian convolution, except that pixel values of the resultant image data structure are summed to generate values for pixels of the registration image and the selected pixel values of the data structure to be summed are offset in the y-direction from the corresponding pixel location of the registration image.

The second step of the x-axis Gaussian convolution is illustrated in FIG. 17. In this step, the value for a given pixel location 1720 of the resultant image is determined by adding together:

the values of two pixels 1725 and 1730 from resultant image 1510, the locations of pixels 1725 and 1730 being offset in the y-direction by three pixel locations from the pixel location of resultant image 1510 which corresponds to pixel location 1720, and the values of two pixels 1735 and 1740 from the six-multiplier image 1610, the locations of pixels 1735 and 1740 being offset in the y-direction by two pixel locations from the pixel location of the 6-multiplier image 1610 which corresponds to pixel location 1720, and the values of two pixels 1745 and 1750 from the fifteen-multiplier image 1620, the locations of pixels 1745 and 1750 being offset in the y-direction by one pixel location from the pixel location of the 15-multiplier image 1420 which corresponds to pixel location 1720, and the value of a pixel 1760 from the twenty-multiplier image 1630, the location of pixel 1760 corresponding to pixel location 1720.

The sums are completed to produce a value for each pixel of registration image 1710, so that registration image 1710 represents the convolution of resultant image 1510 with the y-axis Gaussian kernel.

FIG. 18A again shows layout image patch 710. FIG. 18B shows a registration image 1810 produced by convolving layout image patch 710 with the Laplacian and Gaussian operators in the manner just described. Comparison of FIGS. 18A and 18B shows that the edges and corners of the layout image patch are smoothed by the convolution processing.

FIG. 19A again shows SEM image patch 810. FIG. 19B shows a registration image 1910 produced by convolving SEM image patch 810 with the Laplacian and Gaussian operators in the manner just described, and further convolving with a second Gaussian kernel 2000 having sparse operators, illustrated in FIG. 20. The first Gaussian convolution (using the kernel of FIG. 12) smooths high-frequency shot noise and prevents aliasing. The second Gaussian convolution eliminates voltage-contrast beating patterns in the SEM image patch. Voltage contrast is the difference in image brightness caused by different voltage potentials on features of the integrated circuit device being imaged with the SEM. The second Gaussian convolution is carried out in the manner described above, but the use of zeros between each coefficient (FIG. 20) changes the Gaussian-kernel spread from seven pixels to thirteen pixels in each of the x- and y- directions. This increases the effective kernel size, smoothing higher-frequency patterns such as the voltage contrast beating pattern. Comparison of FIGS. 19A and 19B shows that the features of the SEM image are enhanced and the noise visible in FIG. 11B has been smoothed.

Those of skill in the art will recognize that the second Gaussian convolution is not be required in all cases. For example, a single Gaussian convolution is adequate for processing layout patch 710 as described. Other Gaussian kernels may be used as appropropriate to the image being processed.

This completes preparation of the registration images. Layout registration image 1810 serves as a first registration image for autocorrelation, and SEM registration image 1910 serves as a second registration image for autocorrelation.

Autocorrelation

Autocorrelation of registration images 1810 and 1910 is performed to determine the x-axis and y-axis offset required to best match one image against another. Matching on the sign-representation of the convolution increases stability and makes the matching process much more tolerant of noise. Simply stated, rather than matching points where the Gaussian-smoothed Laplacian images cross zero, the positive areas of a first registration image are matched with the positive areas of a second registration image, and the negative areas of the first registration image are matched with the negative areas of the second registration image. For this purpose, the registration images are binarized on the sign of the convolution before correlation. That is, each pixel of a registration image is assigned a binary value (zero or one) depending on the sign (positive or negative) of the pixel value. The autocorrelation uses the exclusive-OR (EXOR) function to match pixels of like sign (positive or negative) in a pixel-by-pixel operation.

FIG. 21 shows various images juxtaposed to illustrate the autocorrelation objective. A CAD layout image patch (a) is convolved as described above to create a layout registration image (b) of 178×178 pixels, and binarized. A SEM image patch (c) is convolved as described above to create a SEM registration image (d) of 128×128 pixels, and binarized. Image (b) is used as the search area. Image (d) is used as a moving patch. The autocorrelation process finds a relative x-y offset position between the images at which image (d) best matches image (b).

Autocorrelation begins by aligning the upper-left pixel of SEM registration image (d) with the upper left pixel of layout registration (b) so that the 128×128 pixel locations of image (d) are aligned respectively with the upper-left 128× 128 pixel locations of image (b). For each of the 128×128 pixel locations, an EXOR between the binarized intensity values of image (d) and image (b) is performed. The resulting 128×128 binary (pixel-correlation) values are summed and the sum is taken as an image-correlation value for that relative offset position of images (d) and (b). Image (d) is then shifted relative to image (b) by one pixel location, the EXOR is performed, and the sum of the EXORed pixels is taken as a correlation value for this new relative offset position. The process is repeated to produce a correlation value preferably for each possible position of SEM registration image (d) relative to layout registration image (b).

Figure 22A:
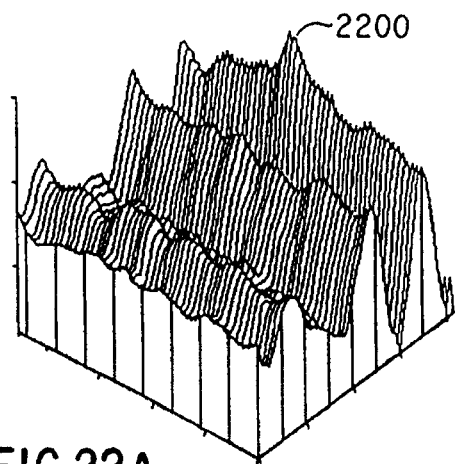
FIG. 22A is an autocorrelation surface produced by mapping the values for autocorrelation of images (d) and (b) of FIG. 21 in accordance with the invention.

The significance of the correlation values can be seen from FIG. 22A, in which the correlation values for all possible offset positions of image (d) to image (b) are mapped to produce an autocorrelation surface. The highest peak (correlation peak 2200) of the autocorrelation surface represents a relative x-y offset between the images at which the two images are best matched.

Figure 22B:
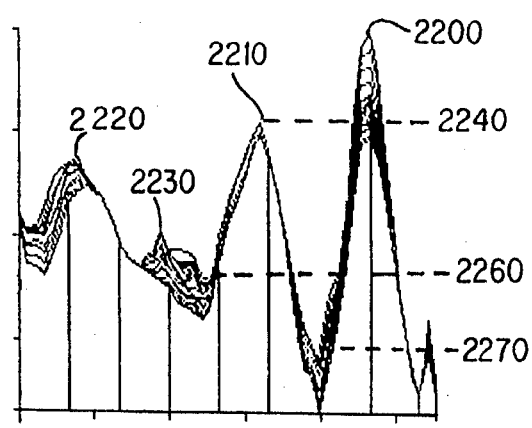
FIG. 22B shows autocorrelation values along the x-axis of an x-z plane intersecting the correlation peak of the surface of FIG. 22A.
Figure 22C:
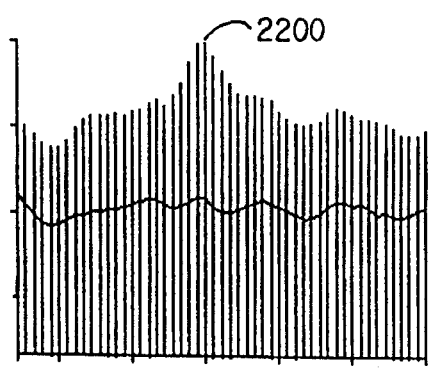
FIG. 22C shows autocorrelation values along the y-axis of a plurality of y-z planes intersecting the surface of FIG. 22A.

Image (e) of FIG. 21 is a patch from image (b) which has been found to best match image (d). Image (e) is shown to the right of image (d) to show alignment of horizontal matching features. Image (g) is the same as image (e) and is shown below image (d) to show alignment of vertical matching features. FIG. 22B shows the autocorrelation values along the x-axis of an x-z plane intersecting correlation peak 2200. FIG. 22C shows the autocorrelation values along the y-axis of a plurality of y-z planes, including a y-z plane intersecting correlation peak 2200. False correlation peaks can be seen at 2210, 2220 and 2230.

In this example using a 178×178 search area and a 128×128 moving patch, offset of the images is determined to within ±25 pixels on the x-axis and to within ±25 pixels on the y-axis. Performing autocorrelation in the requires 42,614,784 (128×128×51×51) iterations to complete.

Optimizing the Autocorrelation

Significant time can be saved by preparing the first registration image (e.g., by convolving and bit-packing layout image patch 710) while the stage is moving to its best approximation of alignment. (FIG. 5, step 500.) Additional time saving can be obtained by optimizing the autocorrelation as will now be described.

A microprocessor preferred for carrying out methods of the invention has 32-bit word size. The data required for a registration image comprises, for example, 128×128 words of 32-bits per word. When the registration image is binarized on the sign of the convolution, each binarized intensity value can be represented as one bit of a 32-bit word. This is known as bit-packing, illustrated in FIG. 23. The 128×128×32 bits of data 2300 describing the registration image are thus bit-packed to a size of 128×4×32 bits of data 2310. With the data bit-packed, 32 EXORed pixel operations of the autocorrelation can be performed in a single microprocessor instruction. The result of the EXOR operation is a 32-bit word. A table lookup is then used to determine the number of bits matched. Using a serial microprocessor in this parallel fashion reduces the number of iterations for autocorrelation of a 128×128 moving patch with a 178×178 image from 42,614,784 (128×128×51×51) to 1,331,712 (128×4×51×51).

Figure 24:
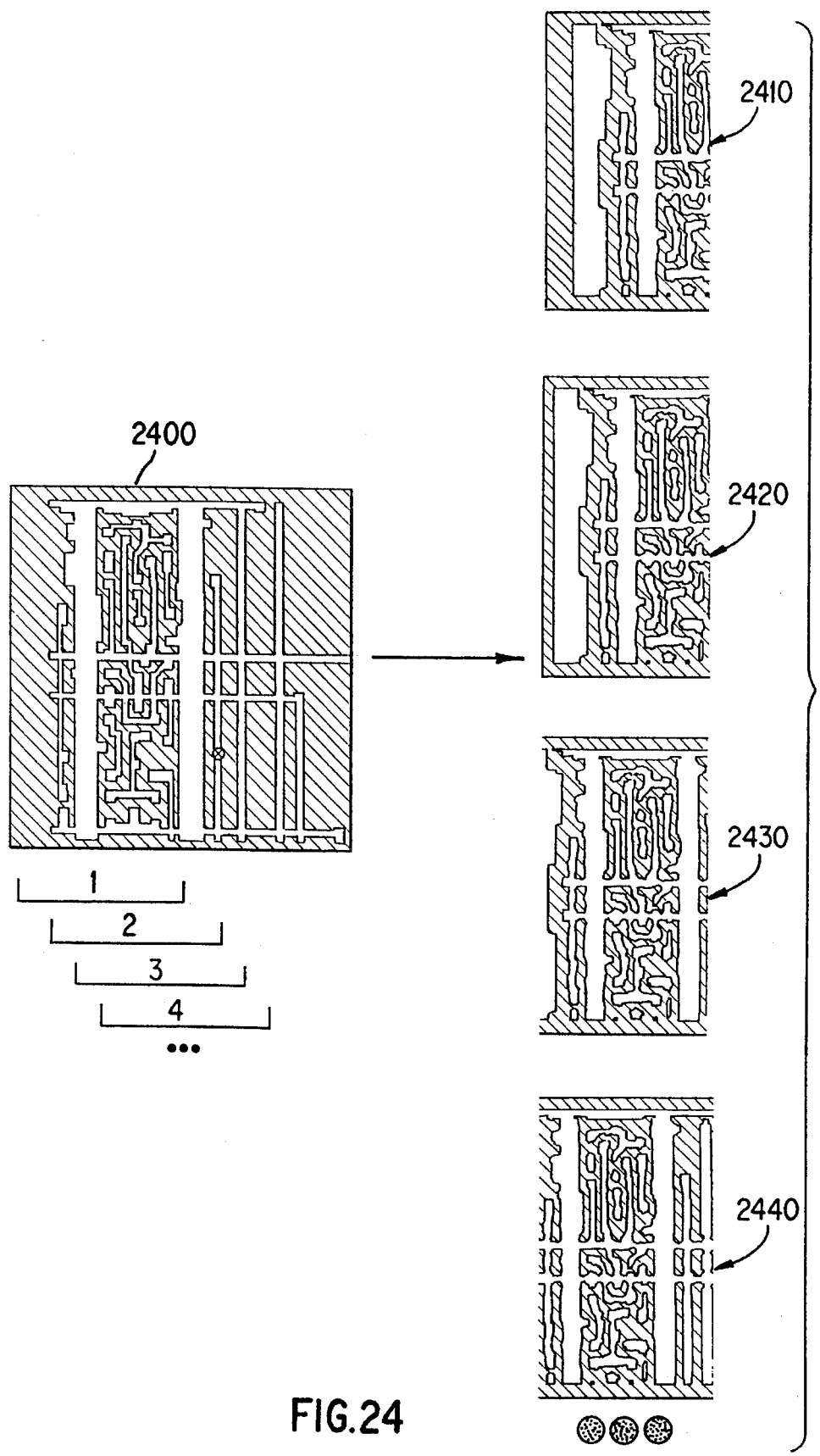
FIG. 24 illustrates selection of correlation patches from a registration image for optimized autocorrelation in accordance with the invention.

Further time is saved by reducing the number of bit-wise shift operations. For this purpose, a separate bit-shifted image strip is extracted from the larger binarized registration image for each possible offset in either the x- or y- direction. For example, to autocorrelate a 128×128 moving patch with a 178×178 image, a strip of 128×178 pixels from the 178×178 image is extracted for each possible offset along the x-axis. FIG. 24 illustrates four such strips, 2410, 2420, 2430, 2440, extracted from a registration image 2400. To determine offset within ±25 pixel locations, 51 such image strips bit-shifted along the x-axis are generated. The memory required to store these image strips is reasonable because they are bit-packed. With judicious selection of the moving patch size as in this example, the data describing the image strips falls on 32-bit boundaries so that bit-shifting for vertically-shifted images is not required.

Attention is again directed to the probe-beam placement example of FIG. 5. If the optimized autocorrelation is used in determining offset of a SEM image to a layout image, the stage motors are checked when preparation of the bit-shifted layout image strips is complete. If the motors are still moving the stage to the new coordinates, the registration process waits. When stage motion is complete (FIG. 5, step 520), the SEM image is acquired and used to prepare the moving patch.

Figure 25:
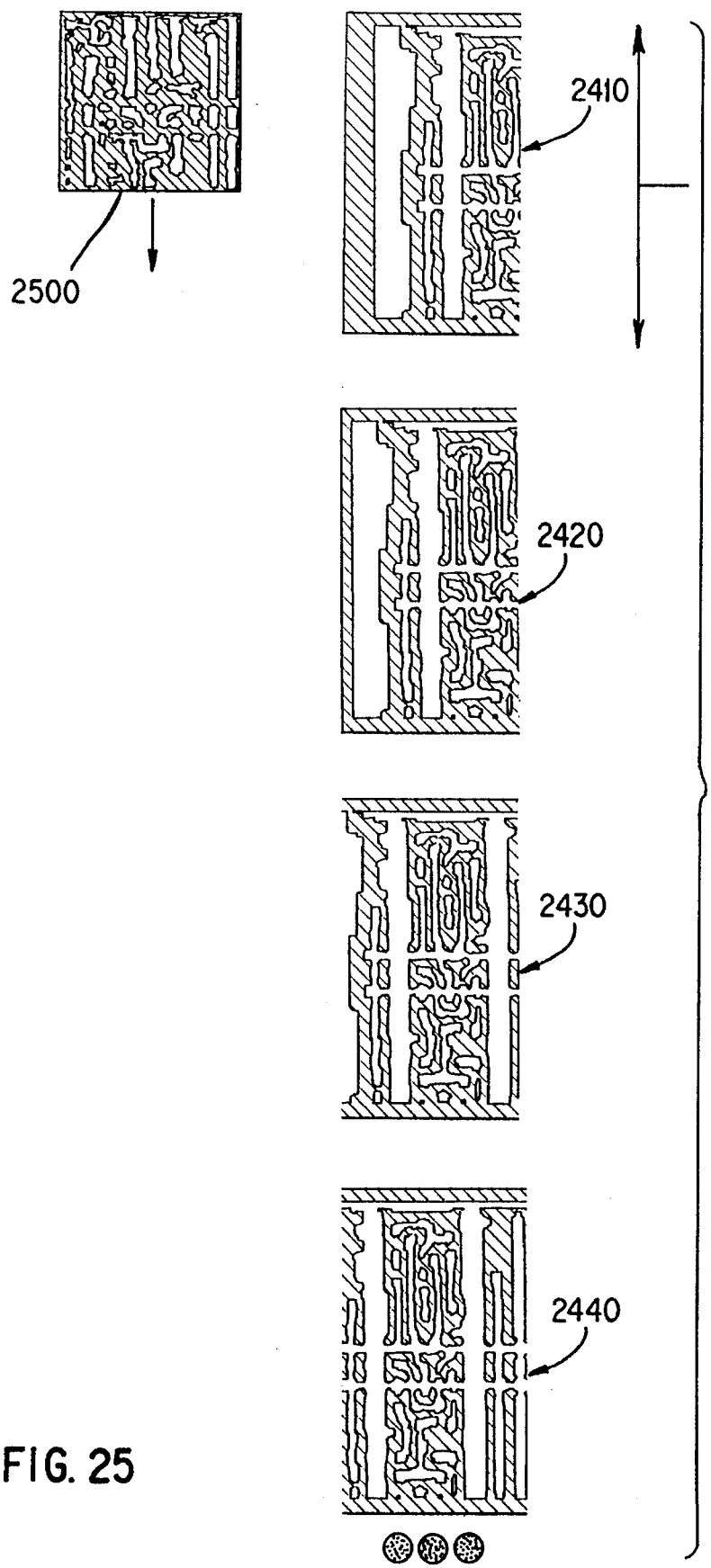
FIG. 25 illustrates a method of performing optimized autocorrelation in accordance with the invention.

After preparation of the image strips and the moving patch, optimized autocorrelation is carried out as illustrated in FIG. 25. The moving patch 2500 is correlated with the first image strip at a first position (e.g., y-offset equals zero) by performing the EXOR function for the entire overlap region of 128×128 pixels in a single microprocessor operation. The result of the EXOR operation is used to determine a correlation value for this offset (x=0, y=0). The SEM registration image is shifted down one row (e.g., y-offset equals 1 pixel), the EXOR function is performed, and a correlation value is determined for this offset (0,1). The sequence is repeated for each of the 51 possible y-offsets of each of the 51 image strips. Autocorrelation performed in this fashion benefits from the speed of bit-packing but eliminates the need to perform bit-shifting operations during autocorrelation. The image strip producing the best match with the moving patch determines the offset of the SEM image relative to the layout image along the x-axis. The best match along the length of that image strip determines the offset along the y-axis. This optimized autocorrelation process produces the same correlation values as are shown in FIGS. 22A–22C, and is efficiently carried out using a general-purpose microprocessor.

Implementation

The attached Appendices list computer code in the C-language suitable for implementing an embodiment of the present invention. The computer code can be implemented in any suitable general-purpose processor, such a Motorola 68020 processor of a Sun Microsystems 3/160 workstation operating UNIX Sun Release 3.2. Appendix A gives the general flow of the process. Appendix B performs a Laplacian convolution. Appendix C performs Gaussian convolution. Appendix D performs image bit-packing. Appendix E creates an array of x-shifted image portions. Appendix F autocorrelates the bit-packed images.

Interpretation

One measure of the autocorrelation is the correlation coefficient. Referring to FIG. 22A, the correlation coefficient is the relationship of the height of correlation peak 2200 to the correlation surface. High correlation coefficients have been obtained in matching a SEM image to another SEM image in accordance with the invention. Correlation coefficients obtained in matching a SEM image to a CAD layout image tend to be lower, due to voltage contrast and the absence of buried-conductor edges. For example, vertical rectangular areas 730 and 735 (power and ground planes of the IC) shown in the layout image of FIG. 7 are not visible in the corresponding SEM image of FIG. 8. Also, missing in the convolved SEM image of FIG. 19B are the two central horizontal conductors 740 and 745 shown in the layout image of FIG. 7. Such features are treated as noise in the image; as long as enough of the image is intact, a correct match is made.

Another problem incurred in matching these type images arises from the repetitive horizontal and vertical features. The correlation surface shown in FIG. 22B shows false peaks 2210, 2220 and 2230. These are due to the partial matching of different vertical conductors. Further characterization of the correlation surface generated by a mismatch is shown in FIG. 22B. The difference between the correlation coefficient (z-axis value) of correlation peak 2200 and that of the next highest peak 2210 determines a peak-to-peak threshold, shown by dashed line 2240. The base threshold of false peak 2200 is shown by dashed line 2250, and the base threshold of correlation peak 2000 is shown by dashed line 2260. The peak-to-peak threshold, and the mass of each of the peaks, can be used to determine "goodness" of the registration.

Autocorrelation can also be enhanced by an understanding of the IC device's manufacturing process. Referring again to FIG. 21, image (f) shows an overlay of SEM registration image (d) and layout registration image patch (e). The gray areas between the black and white are due to feature size differences. Image (h) of FIG. 21 shows an overlay of SEM registration image (d) and layout registration image patch (e), with matching pixels shown in white and mismatching pixels shown in black. The outlines of specific features are evident in image (h). This is due to variations of line width resulting from the semiconductor manufacturing process.

Applications

Those of skill in the art will recognize that the methods of the invention will find many applications in connection with charged-particle beam systems employing general-purpose processors, including the Schlumberger "IDS 5000™" and "IDS 7000FIBstation™" systems. Relative image offsets are determined without addition of specialized processing hardware, allowing automation of operations previously requiring repeated human intervention. Without limiting the scope of the invention as defined by the claims, a few such applications are as follows.

1. Backtracing a Failing IC (offset of SEM image to layout image)

The probe-beam placement method described with reference to FIG. 5 can be used to advantage in backtracing a failing IC to location the origin of a failure.

In conventional backtracing with an E-beam system, a failing output pin of a device is identified, e.g., by exercising the device and detecting an unexpected signal at the failing output pin. The user, or an automated diagnostic software package, then recommends an IC node to probe with a beam. Measured information at this node is used to make a decision about successive places to acquire measurements. Backtracing through the circuit by making successive measurements can eventually lead to a probe location where measured data matches expected data, leading to a conclusion about the location of a failing element in the IC. Each time a net is selected for probing, the system uses the linked schematic/layout data to map the net to a specific place on a specific conductor of the IC. A window/probe locator program, considering conductor width, exposure and crosstalk, determines the best place to probe as an x,y coordinate in the CAD layout data. A corresponding field-of-view and probe location are determined and the probe beam is positioned accordingly. With the prior-art systems, stage alignment errors and field effects can demand operator intervention to assure accurate placement of the probe beam at each probe location. Without accurate placement of the probe beam, measurements made by the diagnostic process may not be valid. Avoiding the need for such repeated operator intervention in accordance with the invention can save substantial time and cost.

2. IC-Fault Difference Imaging (offset of SEM image to SEM image)

Figure 26:
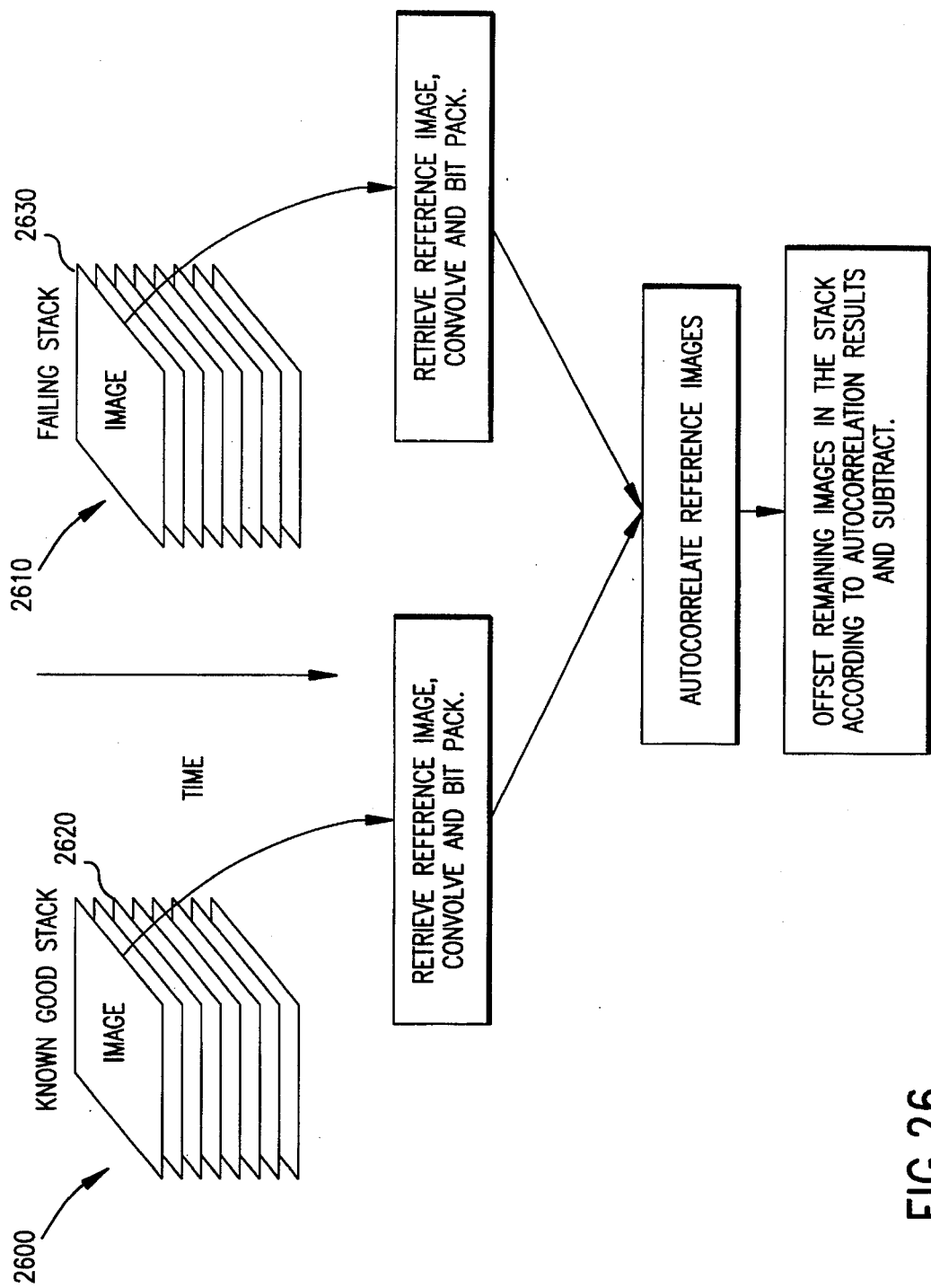
FIG. 26 illustrates a method of preparing a stack of difference images in accordance with the invention for IC fault diagnosis.

Determining image offset in accordance with the invention can be used to automate IC fault detection, as illustrated in FIG. 26.

In accordance with a prior-art technique, a charged-particle beam imaging system such as a SEM is used to acquire a series (a "stack" 2600) of voltage-contrast images of a known good IC taken at a fixed field of view. Each image is taken at a discrete time during application of a cyclical test pattern to the IC. A similar "stack" 2610 of voltage contrast images of a failing IC is taken at approximately the same fixed field of view and at the same discrete times in the test pattern cycle. A stack of difference images is then prepared, each representing the difference at a given time in the cycle between an image of the "good" stack and a corresponding image of the "failing" stack. Because voltages on the conductors change potential over time during the test cycle, the location and time in the cycle at which a failure occurs is readily identified by examining the "difference" stack. As the difference image is prepared by subtracting intensity values of the images pixel-by-pixel, the images must be properly aligned. In the past, assuring alignment has required considerable human intervention.

In accordance with the invention, the offset between a reference image 2620 of the good stack and a corresponding reference image 2630 of the failing stack is determined. That is, each of images 2620 and 2630 is retrieved, convolved and bit-packed as a binarized image. The binarized images are autocorrelated to determine the offset. Images 2620 and 2630 are then registered to one another using the determined offset, and a first difference image is prepared. If all images of the good stack are taken at a fixed field of view and all images of the failing stack are taken at a fixed field of view, the offset determined for the first image 2620 and corresponding image 2630 can be used to register each image of the good stack to a corresponding image of the failing stack. For optimum determination of offset in accordance with the invention, the reference images of the good stack and of the failing stack are acquired before or after (not during) application of the test pattern to the IC.

3. Batch IC Repair (offset of live SIM image to stored SIM image)

Figure 27:
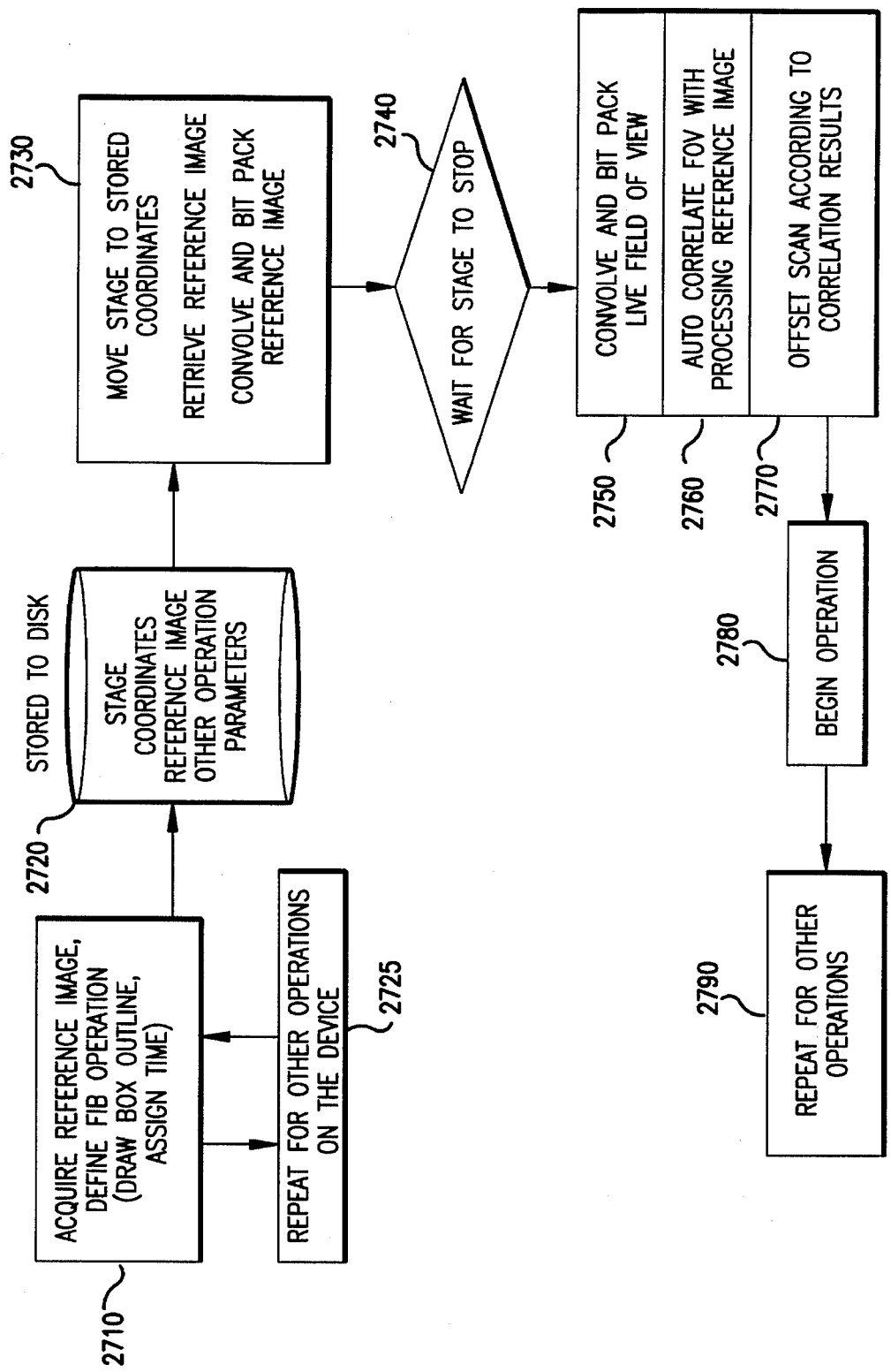
FIG. 27 illustrates a method of automating repair of a batch of IC devices in accordance with the invention.

FIB systems are commonly used to repair IC devices by cutting and/or depositing material at selected locations. It is often desired to make the same repair on each of a batch of IC devices. The repair process can be automated for an entire IC batch in accordance with the invention, as illustrated in FIG. 27.

For example, a first IC device is placed in a FIB system. A SIM image is acquired over a field of view which includes a selected region where a first operation is to be performed, and parameters of the operation are defined, such as beam power, milling time, boundaries of the selected region, etc. (step 2710). The parameters are recorded, along with stage coordinates for that field of view and the SIM image (step 2720). These steps are repeated for each of the desired operations (step 2725). The result is a recorded "script" for controlling the FIB system to carry out the operations, the script including at least one SIM reference image of the device for each stage position. If desired, the script can be recorded while repair operations are being carried out on a first device of the batch, and the effectiveness of the repair verified before processing other devices of the batch.

The script can then be used to control the FIB system for automatically repairing another device of the batch. Each time the stage is moved to a new coordinate location, the corresponding SIM reference image is retrieved, convolved and bit-packed to produce a binarized first image (step 2730). When the stage stops (step 2740), a live SIM image of the device is acquired, convolved and bit-packed to produce a binarized second image (step 2750). The binarized first and second images are autocorrelated to determine offset between the SIM reference image and the live SIM image (step 2760). The determined offset is then used as a correction in positioning the FIB relative to the device (step 2770) when carrying out the scripted operation. Variables such as stage positioning error and field effects are thus automatically compensated. The FIB mill/deposit operation is then performed as scripted (step 2780). Steps 2730–2780 can be repeated for any number of scripted operations (step 2790).

4. Auto-Calibration of Charged-Particle Beam Systems (offset of SEM image to SEM image or SIM image to SIM image)

Determining offset between images can be used in calibration of E-beam and FIB systems. For example, different beam currents are used in various FIB operations. In general, higher beam currents are used for milling in order to remove material at a fast rate, while lower beam currents are used for imaging in order to obtain higher resolution images. A slight image offset typically results when beam current is changed, which can result for example in milling an area somewhat offset from the desired area to be milled.

Figure 28:
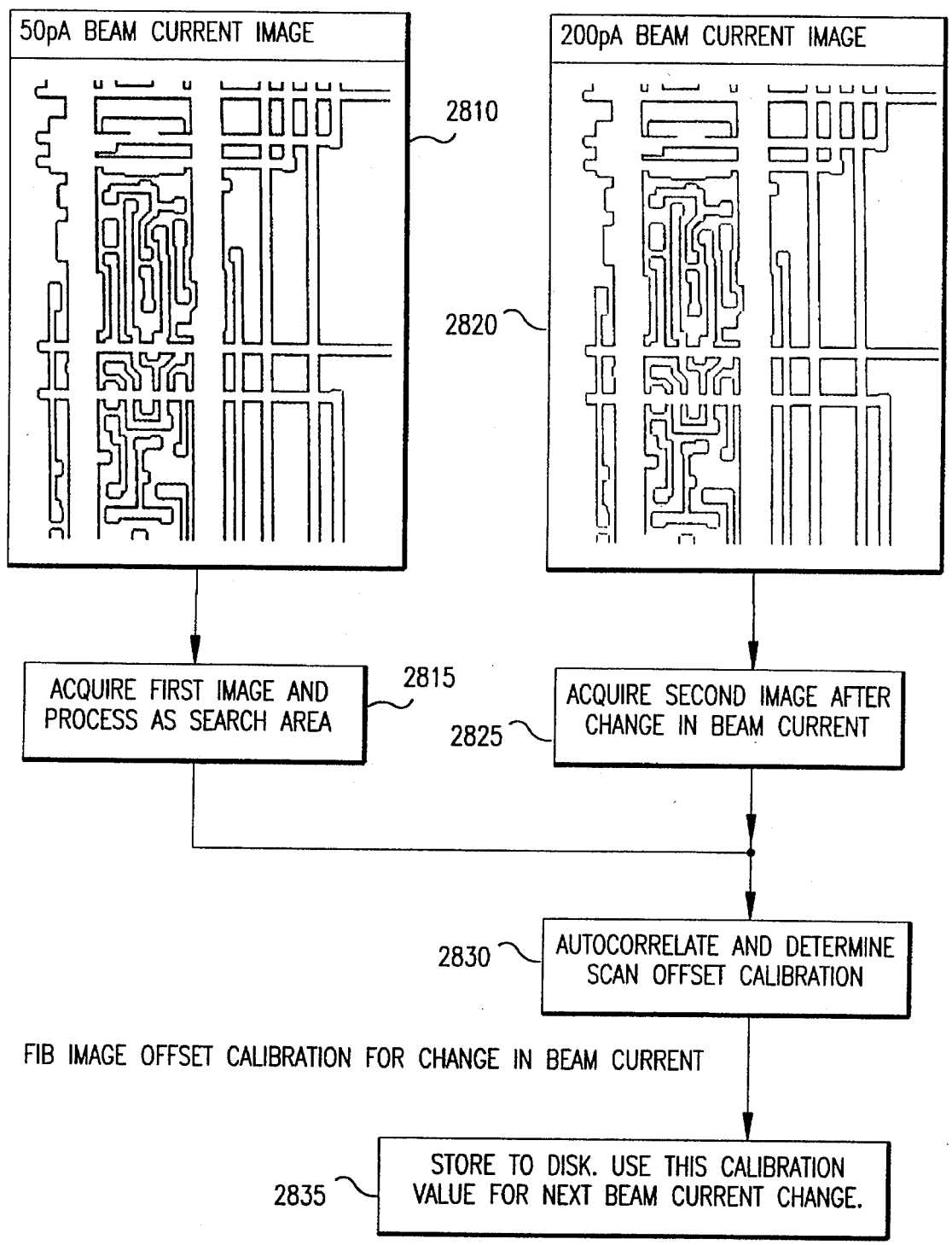
FIG. 28 illustrates a method for calibrating the image offset when beam current is changed between a relatively low level and a relatively high beam level.

FIG. 28 illustrates a method for calibrating the image offset when beam current is changed between a relatively low beam current (e.g., 50 pA) and a relatively high beam current (e.g., 200 pA). A first image 2810 is acquired at a first beam current (e.g., a low current) and the image or a patch of the image is processed as a search area, i.e., to prepare a first registration image as described above (step 2815). When the beam current is changed to a second level (e.g., a high current), a second image 2820 is acquired and the image or a patch of the image is processed to prepare a second registration image (step 2825). The first and second registration images are autocorrelated and the offset between the images is determined as described above (step 2830). The determined offset can be stored in memory and used to offset the beam scan each time the beam current is switched between the two values (step 2835), or the offset can be determined anew each time the beam current is switched. The technique can likewise be used to calibrate offset between images for other variable system parameters, such as beam scanning offset or stage motion offset.

5. Long-Duration Waveform Acquisition (offset of SEM image to SEM image)

E-beam systems are commonly used not only to acquire a SEM image of a device but also to acquire a waveform on a conductor of the device. Image acquisition and waveform acquisition are multiplexed—the image is acquired by scanning the beam over a region of the device during first repetitive time intervals and the waveform is acquired by directing the beam at a probe location on the conductor of interest during second repetitive time intervals alternating with the first time intervals. Acquisition of a long waveform (e.g., >2 seconds) can be incomplete or inaccurate because the beam tends to drift from the intended probe location due to changes in the filament of the electron gun and/or other causes.

It is possible in accordance with the invention to correct for beam drift to assure complete and accurate acquisition of a long waveform. From time to time during acquisition of the waveform, a SEM image is acquired, offset between the latest SEM image and a previous SEM image is determined, and the probe beam positioning is adjusted using the determined offset. For example, to acquire a long waveform:

a. Establish initial coordinates for the intended probe location, e.g., by placing a probe icon in the center of a conductor appearing in a displayed SEM image of the device, b. Acquire a reference SEM image which includes the probe location, c. Begin waveform acquisition by directing the probe beam using the initial coordinates of the probe location, d. Multiplex SEM image acquisition with waveform acquisition to acquire an updated SEM image, e. Determine offset between the updated SEM image and the reference SEM image by convolving and autocorrelating the images, f. Prepare updated coordinates for the probe location by adjusting the initial coordinates using the determined offset, g. Continue waveform acquisition by directing the probe beam using the updated coordinates of the probe location, and h. If desired, repeating steps d. through g. from time to time until waveform acquisition is complete.

Figure 29:
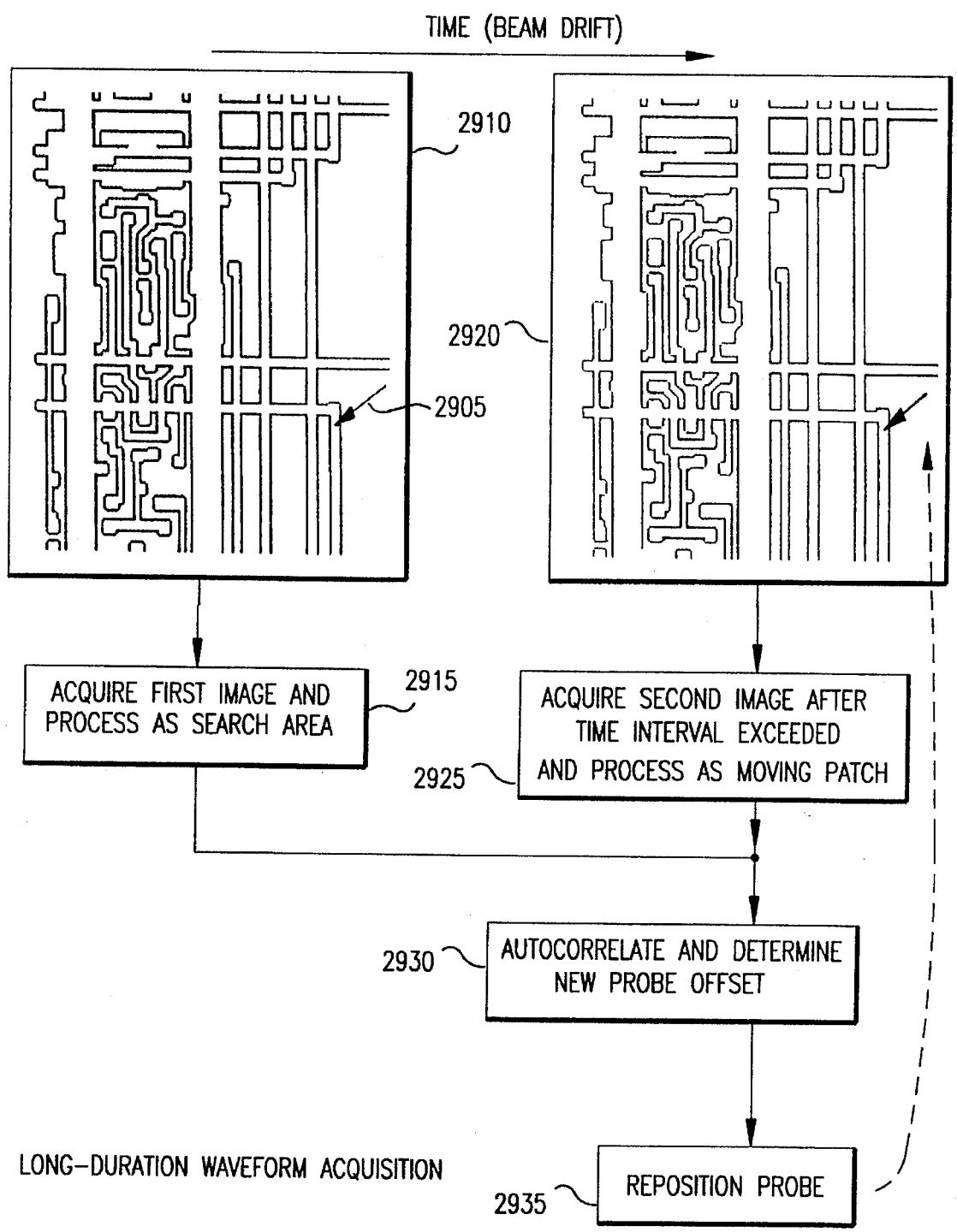
FIG. 29 illustrates a preferred method of long-duration waveform acquisition.

FIG. 29 illustrates a preferred method of long-duration waveform acquisition. A SEM image 2910 of a portion of an IC is acquired and a probe icon 2905 is placed on the image. A patch of the first image is processed as a first registration image to be used as a search area (step 2915). After performing waveform acquisition for some period of time, a second SEM image 2920 is acquired and processed as a second registration image to be used as a moving patch (step 2925). The first and second registration images are autocorrelated and a probe offset is determined (step 2930). The determined offset is used to reposition the probe to compensate for beam drift (step 2935). Probe positioning can be updated from time to time by determining a new offset using a newly-acquired second image.

The foregoing description of preferred embodiments of the invention is intended as illustrative only, and not as a limitation of the invention as defined by the claims which follow. Those of skill in the art will recognize many modifications which may be made in the preferred embodiments within the spirit and scope of the claimed invention.

For most FIB operations, high magnification is chosen due to the need for accurate alignment of the beam with the device structure to be milled. If desired, one may begin with relatively lower magnification, determine offset (e.g., between a layout image on which is marked the area to be milled and a SEM image of the device), then change to higher magnification and determine offset once again.

Appendix A
General Process Flow
Copyright © Schlumberger Technologies Inc.

```
#include <stdio.h>
#define D2G 1
#define hide(ex)
#define MAX_SHIFT   31

/* patch size + search area + gauss
*/
#define PATCH_SIZE  256
#define IMG_LEN          (PATCH_SIZE + (MAX_SHIFT * 2) + 26)
#define IMG_SIZE    (IMG_LEN * IMG_LEN)
#define DEFAULT_SHIFT    14

/* scratch space
*
*    OFF1     buffer 0
*    OFF2     buffer 1
*    OFF3     buffer 3
*    OFF4     buffer 4
*    OFF5     buffer 5
*    OFF6     buffer 6
*/
/* multiplier data offsets
*/
#define    OFF1      0
#define OFF2         IMG_SIZE
#define OFF3         (2 * IMG_SIZE)
#define OFF4         (3 * IMG_SIZE)
#define OFF5         (4 * IMG_SIZE)

unsigned char am[512 * 512];
int imgdebug;
int shift_error;
int x_shift_error;
int y_shift_error;
int peak_shift_error;
unsigned char ref_orig[512 * 512];
unsigned char mov_orig[512 * 512];
int i1_data[OFF5];
int i2_data[OFF5];
unsigned int ref_bits[IMG_SIZE / 32];
unsigned int mov_bits[IMG_SIZE / 32];
unsigned int shifts[458752];
unsigned short bitstable[65536];
unsigned int bitflag[33];
unsigned char dbg[512 * 512];
```

```
MOTOR motor1;
MOTOR motor2;
int debug;      /* this ugly hard code for the motors */ main(argc, argv)
int argc;
char *argv[];
{
    int i,j,k;
    float cc;
    int xo, yo;
    int status;
    void mkbitstable();

/* set defaults control params
    */
    strcpy(i1,argv[1]);
    strcpy(i2,argv[2]);
    shift_error = argv[3];
    cntl.debug = 0;
    cntl.cycles = 2;
    cntl.x_range = shift_error;
    cntl.y_range = shift_error;
    patchsize = 128;

/* this is the image registration procedure.
     * part A. of figure 5. starts this procedure
     */ mkbitstable();      /* create lookup table used for correlation
                        */
    motoropen();        /* open motor communication */

/* part B. of figure 5.
    */

/* open file/frame buffer and read image into memory (Search
    area)
    */
    if((f1 = open(i1,O_RDONLY)) != -1) {

/* 256:halfimage + 128:half patch + 13:gauss + search
        */
        read (f1,am,(256+(patchsize/2)+13+MAX_SHIFT)*512);
        close(f1);
    } else {        /* could not open file */
        exit(-1);
    }

/* Size and laplace convolve image "am" and output to "i1_data"
```

```
        */
        laplace(am, i1_data, cntl.win_width + (2 * g_margin) + 64,
                cntl.win_height + (2 * g_margin) + ymargin,
                cntl.win_ul_x - g_margin - 32,
                cntl.win_ul_y - g_margin - cntl.y_range);

/* run 1st gaussian convolution on i1_data, and put the result
         * back into i1_data
         */
        gauss1(i1_data, cntl.win_width + (2 * g_margin) + 64,
                cntl.win_height + (2 * g_margin) + ymargin);

/* run 2nd gaussian convolution on i1_data, and put the result
         * back into i1_data
         */
        gauss2(i1_data, cntl.win_width + (2 * g_margin) + 64,
                cntl.win_height + (2 * g_margin) + ymargin);

/* bit pack the image
         */
        words = cntl.win_width / 32 + 2;
        rows = cntl.win_height + ymargin;
        binarize_bits(i1_data, mov_bits, words, rows, g_margin);

/* create shift stripped image figure 24.
         */
        words -= 2;
        next = rows * words;
        rows = cntl.win_height + ymargin + 1;
        sptr = shifts;
        for(i = -cntl.x_range; i <= cntl.x_range; i++) {
            shift_bits(mov_bits,sptr,words,rows,i);
            sptr += next;
        }

/* poll until motor has stopped
         */
        while(!motorck());

/* part C. of figure 5
         */

/* open 2nd file/frame buffer and read image into memory (Moving
        patch)
         */
        if((f1 = open(i2,O_RDONLY)) != -1) {
            read (f1,ref_orig,(256 + (patchsize/2) + 13 + MAX_SHIFT) *
                512);
```

```
        close(f1);
    } else {
        exit(-2);
    }

/* preform the same image processing steps as above with the new
    image
    */
    laplace(ref_orig, i2_data, cntl.win_width + (2 * g_margin),
                    cntl.win_height + (2 * g_margin),
                    cntl.win_ul_x - g_margin,
                    cntl.win_ul_y - g_margin);

gauss1(i2_data, cntl.win_width + (2 * g_margin),
            cntl.win_height + (2 * g_margin));
    gauss2(i2_data, cntl.win_width + (2 * g_margin),
            cntl.win_height + (2 * g_margin));

words = cntl.win_width / 32;
    rows = cntl.win_height;
    binarize_bits(i2_data, ref_bits, words, rows, g_margin);

/* preform fast correlation and print the results
    */
    corr_bits(ref_bits,shifts,next,words, (2 * cntl.x_range) + 1,rows
    * words,
                &xs,&ys,&peak);
    printf("Offset X:%d    Offset Y: %d    Correlation Coeff: %f"
            ,shift_error - xs,
            -(shift_error - ys),
            2.0 * (((float)peak) / (128.0 * 128.0)) - 1.0);

motorclose();      /* close motor communication */
    exit(0);
}
```

Appendix B
Laplacian Convolution
Copyright © Schlumberger Technologies Inc.

```
/* figures 9. and 10A and 10B and 11A and 11B.
*/

/* laplace
*/
void laplace(input, output, width, height, ulx, uly)
unsigned char *input;
int *output;
int width;
int height;
int ulx;
int uly;
{
register unsigned char *orig;
register int *result;
register int tmp;
register int i;
register int j;
register int collen;
register int next_row;

/* position input pointer to beginning of patch to be convolved
*/
     orig = input + (512 * uly) + ulx;

/* position destination point to correct scratch area offset
*/
     result = output;

collen = width;
     next_row =  512 - width;
     for(i = height; --i != -1;) {
         for(j = collen; --j != -1;) {
             tmp =  (int)*(orig - 512);
             tmp += (int)*(orig + 512);
             tmp += (int)*(orig - 1);
             tmp += (int)*(orig + 1);
             tmp -= (int)*orig  << 2;
             *result++ = tmp;
             orig++;
         }
         orig += next_row;
     }
}
```

Appendix C
Gaussian Convolution
Copyright © Schlumberger Technologies Inc.

```
/* figures 12, 13, 14, 15, 16, 17, 18A, 18B, 19A and 19B.
/* gauss1
*/
void gauss1(input,width,height)
int *input;
int width;
int height;
{
    int area;

area = (height * width);

/* figures 13. and 14.
*/

/* gaussian X multiply
*  this creates coeffecient multiplier images of the original
*  it reads the orignial from scratch buffer 1
*  6 multiplied image in buffer 2
*  15 multiplied image in buffer 3
*  20 multiplied image in buffer 4
*/
{
    register int *cp;
    register int t0;
    register int m16;
    register int m4;
    register int m2;
    register int tmp;
    register int i;

cp = input;
    i = area;
    for(;--i != -1;) {
            t0 = *cp;  /* get data laplace image */
            m2 = t0 << 1;    /* x 2 */
            m4 = m2 << 1;    /* x 4 */
            m16 = m4 << 2;   /* x 16 */ tmp = m4;
            tmp += m2;
            *(cp + OFF2) = tmp;  /* img of 6 */ tmp = m16;
            tmp -= t0;
```

```
                    *(cp + OFF3) = tmp; /* img of 15 */ tmp = m16;
                    tmp += m4;
                    *(cp + OFF4) = tmp; /* img of 20 */
                    cp++;
        }
}

/* figure 15.
*/

/* gaussian X add
* this routine adds together all the multiplier images
* and puts the result in the high buffer of the scatch area
*/

{
        register int *a_1; /* pointer to laplace image */
        register int *a_6; /*  6 image */
        register int *a_15; /* 15 image */
        register int *a_20; /* 20 image */
        register int i;
        register int tmp;

i = area - 3;
        a_1 = (input + 3) - 3;
        a_20 = (input + 3) + OFF4;
        a_15 = (input + 3) + OFF3 - 1;
        a_6 = (input + 3) + OFF2 - 2;
        for(;--i != -1;) {
                tmp = *a_20;          /* 20 */
                tmp += *(a_15 + 2);   /* 15 */
                tmp += *a_15++;
                tmp += *(a_6 + 4);    /* 6 */
                tmp += *a_6++;
                tmp += *(a_1 + 6);    /* 1 */
                tmp += *a_1++;
                *a_20++ = tmp;
        }
}

/* figures 13. and 16.
*/

/* gaussian Y mult
*  this is same as gaussian X multiplier except rather than using the
*  laplacian the result of the gaussian X  addition is used, buffer 4
*  the 20 multiplier is placed in the lower buffer
*    buffer 1  multiplier by 20
```

```
*       buffer 2  multiplier by 6
*       buffer 3  multiplier by 15
*       buffer 4  original multiplier by 1
*/
{
        register int *cp;
        register int t0;
        register int m16;
        register int m4;
        register int m2;
        register int tmp;
        register int i;

cp = input;
        i = area;
        for(;--i != -1;) {
                t0 = *(cp + OFF4);    /* get data X gauss image */
                m2 = t0 << 1;    /* x 2 */
                m4 = m2 << 1;    /* x 4 */
                m16 = m4 << 2;    /* x 16 */ tmp = m4;
                tmp += m2;
                *(cp + OFF2) = tmp; /* img of 6 */ tmp = m16;
                tmp -= t0;
                *(cp + OFF3) = tmp; /* img of 15 */ tmp = m16;
                tmp += m4;
                *cp++ = tmp;    /* img of 20 */
        }
}

/* figure 17.
*/

/* gaussian Y add
*  this adds together the Y multiplier images
*  the result is placed in the low buffer 1
*/
{
        register int *a_20;  /* 20 image */
        register int *a_6;   /*  6 image */
        register int *a_15;  /* 15 image */
        register int *a_1;   /* pointer to X gauss image */
        register int i;
        register int tmp;
        register int o1;
```

```
        register int o2;
        register int o3;

a_20 = (input + (3 * (width)));
        a_6 = (input + (3 * width )) + OFF2 - (2 * width);
        a_15 = (input + (3 * width)) + OFF3 - (1 * width);
        a_1 = (input + (3 * width)) + OFF4 - (3 * width);
        o1 = 2 * width; /* offset for 15 */
        o2 = 4 * width; /* offset for 6 */
        o3 = 6 * width; /* offset for 1 */
        i = area - (3 * width);
        for(;--i != -1;) {
            tmp = *a_20;         /* 20 */
            tmp += *(a_15 + o1);      /* 15 */
            tmp += *a_15++;
            tmp += *(a_6 + o2); /* 6 */
            tmp += *a_6++;
            tmp += *(a_1 + o3); /* 1 */
            tmp += *a_1++;
            *a_20++ = tmp; /* shift down to prevent over flow */
        }
    }
}

/* gauss2 13x1 gaussian
*/
void gauss2(input,width,height)
int *input;
int width;
int height;
{
        int area;

area = (height * width);

/* gaussian X multiply
*   this creates coeffecient multiplier images of the original
*   it reads the orignial from scratch buffer 1
*   6 multiplied image in buffer 2
*   15 multiplied image in buffer 3
*   20 multiplied image in buffer 4
*/
{
        register int *cp;
        register int t0;
        register int m16;
        register int m4;
        register int m2;
        register int tmp;
```

```
        register int i;

cp = input;
        i = area;
        for(;--i != -1;) {
                t0 = *cp; /* get data image */
                m2 = t0 << 1;    /* x 2 */
                m4 = m2 << 1;    /* x 4 */
                m16 = m4 << 2;   /* x 16 */ tmp = m4;
                tmp += m2;
                *(cp + OFF2) = tmp; /* img of 6 */ tmp = m16;
                tmp -= t0;
                *(cp + OFF3) = tmp; /* img of 15 */ tmp = m16;
                tmp += m4;
                *(cp + OFF4) = tmp; /* img of 20 */
                cp++;
        }
}
/* gaussian X add
 * this routine adds together all the multiplier images
 * and puts the result in the high buffer of the scatch area
 */

{
    register int *a_1; /* pointer to orig image */
    register int *a_6; /*   6 image */
    register int *a_15; /* 15 image */
    register int *a_20; /* 20 image */
    register int i;
    register int tmp;

i = area - 6;
    a_1 = (input + 6) - 6;
    a_20 = (input + 6) + OFF4;
    a_15 = (input + 6) + OFF3 - 2;
    a_6 = (input + 6) + OFF2 - 4;
    for(;--i != -1;) {
        tmp = *a_20;          /* 20 */
        tmp += *(a_15 + 4);   /* 15 */
        tmp += *a_15++;
        tmp += *(a_6 + 8);    /* 6 */
        tmp += *a_6++;
        tmp += *(a_1 + 12);   /* 1 */
        tmp += *a_1++;
```

```
                *a_20++ = tmp;
        }
}
/* gaussian Y mult
 * this is same as gaussian X multiplier except rather than using the
 * laplacian the result of the gaussian X  addition is used, buffer 4
 * the 20 multiplier is placed in the lower buffer
 *    buffer 1   multiplier by 20
 *    buffer 2   multiplier by 6
 *    buffer 3   multiplier by 15
 *    buffer 4   original multiplier by 1
 */
{
        register int *cp;
        register int t0;
        register int m16;
        register int m4;
        register int m2;
        register int tmp;
        register int i;

cp = input;
        i = area;
        for(;--i != -1;) {
                t0 = *(cp + OFF4);    /* get data X gauss image */
                m2 = t0 << 1;   /* x 2 */
                m4 = m2 << 1;   /* x 4 */
                m16 = m4 << 2;  /* x 16 */ tmp = m4;
                tmp += m2;
                *(cp + OFF2) = tmp; /* img of 6 */ tmp = m16;
                tmp -= t0;
                *(cp + OFF3) = tmp; /* img of 15 */ tmp = m16;
                tmp += m4;
                *cp++ = tmp;     /* img of 20 */
        }
}
/* gaussian Y add
 * this adds together the Y multiplier images
 * the result is placed in the low buffer 1
 */
{
        register int *a_20; /* 20 image */
        register int *a_6;  /*  6 image */
```

```
        register int *a_15;  /* 15 image */
        register int *a_1;  /* pointer to X gauss image */
        register int i;
        register int tmp;
        register int o1;
        register int o2;
        register int o3;

a_20 = (input + (6 * (width)));
    a_6 = (input + (6 * width )) + OFF2 - (4 * width);
    a_15 = (input + (6 * width)) + OFF3 - (2 * width);
    a_1 = (input + (6 * width)) + OFF4 - (6 * width);
    o1 = 4 * width; /* offset for 15 */
    o2 = 8 * width; /* offset for 6 */
    o3 = 12 * width; /* offset for 1 */
    i = area - (6 * width);
    for(;--i != -1;) {
        tmp = *a_20;            /* 20 */
        tmp += *(a_15 + o1);    /* 15 */
        tmp += *a_15++;
        tmp += *(a_6 + o2); /* 6 */
        tmp += *a_6++;
        tmp += *(a_1 + o3); /* 1 */
        tmp += *a_1++;
        *a_20++ = tmp;
    }
  }

}
```

```
                    Appendix D
                 Image Bit-Packing
       Copyright © Schlumberger Technologies Inc.

Figure 23:
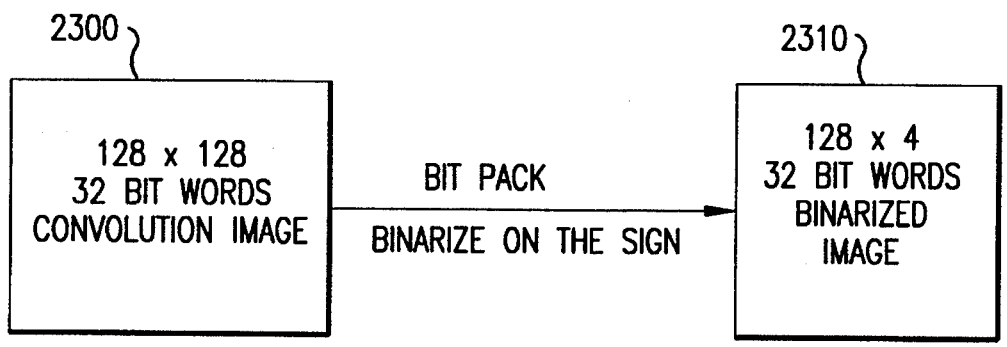
FIG. 23 illustrates bit-packing of registration images in accordance with the invention.

/* figure 23
*/
void binarize_bits(input,output,pix_word,row,margin)
int *input;
unsigned int *output;
int pix_word;
int row;
int margin;
{
register int *ap;
register unsigned int *bp;
register int bitcnt;
register int i;
register int j;
register int margin2;

margin2 = (margin * 2);
    ap = input + margin;
    bp = output;

j = row;
    for(; --j != -1;) {
        i = pix_word;
        for(; --i != -1;) {
            *bp = 0;
            bitcnt = 32;
            for(; --bitcnt != -1;) {
                if((*ap < 1)) {
                    switch(bitcnt) {
                        case 31: *bp |= M32; break;
                        case 30: *bp |= M31; break;
                        case 29: *bp |= M30; break;
                        case 28: *bp |= M29; break;
                        case 27: *bp |= M28; break;
                        case 26: *bp |= M27; break;
                        case 25: *bp |= M26; break;
                        case 24: *bp |= M25; break;
                        case 23: *bp |= M24; break;
                        case 22: *bp |= M23; break;
                        case 21: *bp |= M22; break;
                        case 20: *bp |= M21; break;
                        case 19: *bp |= M20; break;
                        case 18: *bp |= M19; break;
                        case 17: *bp |= M18; break;
                        case 16: *bp |= M17; break;
                        case 15: *bp |= M16; break;
```

```
                                case 14: *bp |= M15; break;
                                case 13: *bp |= M14; break;
                                case 12: *bp |= M13; break;
                                case 11: *bp |= M12; break;
                                case 10: *bp |= M11; break;
                                case 9:  *bp |= M10; break;
                                case 8:  *bp |= M9;  break;
                                case 7:  *bp |= M8;  break;
                                case 6:  *bp |= M7;  break;
                                case 5:  *bp |= M6;  break;
                                case 4:  *bp |= M5;  break;
                                case 3:  *bp |= M4;  break;
                                case 2:  *bp |= M3;  break;
                                case 1:  *bp |= M2;  break;
                                case 0:  *bp |= M1;  break;
                            }
                        ap++;
                    }
                bp++;
            }
        ap += margin2;
    }
}
```

Appendix E
Creating Array of x-Shifted Image Portions

```
/* figure 24
*/
/* note this baby will not shift any more than 32
 * also note that this baby always expects a word of shift margin data
 * between each pix_word set
 * its purpose is to take binarized data like below:
 *        S11 D11 D12 D13 D14 S12
 *        S21 D21 D22 D23 D24 S22
 *             ...
 * (where S is the shift margin word and D is the bitpacked data word)
 * and make:
 *           DSn:11 DSn:12 DSn:13 DSn:14
 *           DSn:21 DSn:22 DSn:23 DSn:24
 *             ...
 *   where the data words are shifted with the data at the word
boundaries
 *   shifted into the adjacent word accordingly
 */
void shift_bits(input,output,pix_word,row,shift)
unsigned int *input;
unsigned int *output;
int pix_word;
int row;
int shift;
{
    register unsigned int *ap;
    register unsigned int *bp;
    register unsigned int tmp1;
    register unsigned int tmp2;
    register int sh1;
    register int sh2;
    register int i;
    register int j;

/* set input pointer to one past the shift margin
 * this corresponds to the moving image being 32 pixels wider than the
 * reference image
 */
    ap = input + 1;

/* set output pointer and register for positive shift
 */
    bp = output;
    sh1 = shift;
    sh2 = 32 - shift;
    if(shift < 0) {                      /* negative shift */
        sh1 = -shift;
```

```
            sh2 = 32 - sh1;
/* rows should be the correlation area + shift error + 1
*/
            j = row;
            for(;--j != -1;) {

/* shift all the pixels in that row, this code shifts the word left
 * then ORS in the shifted pixel to the right to  handle the word
 * boundary
 */
                i = pix_word;
                for(;--i != -1;) {
                    tmp1 = *ap << sh1;
                    tmp2 = *(ap + 1) >> sh2;
                    tmp1 |= tmp2;
                    *bp++ = tmp1;
                    ap++;
                }
/* increment ap past the shift margin before starting the next row
 * note in the for loop ap was incremented once before the test
 * therefore ap need only to be incremented one more time to
 * make up for the margin on either side (2 words)
 */
                ap += 2;
            }
        }
        else if(shift == 0) {
/* same as above but no shifting takes place
*/
            j = row;
            for(;--j != -1;) {
                i = pix_word;
                for(;--i != -1;) *bp++ = *ap++;
                ap += 2;
            }
        }
        else {                          /* positive shift */
            j = row;
            for(;--j != -1;) {
                i = pix_word;
                for(;--i != -1;) {
                    tmp1 = *ap >> sh1;
                    tmp2 = *(ap - 1) << sh2;
                    tmp1 |= tmp2;
                    *bp++ = tmp1;
                    ap++;
                }
                ap += 2;
            }
```

}        }
}

Appendix F
Autocorrelation of Bit-Packed Images
Copyright © Schlumberger Technologies Inc.

```c
/* figure 25.
*/
void
corr_bits(ref,mov,xjump,yjump,fullshift,windowsize,x_shift_error,y_shi
ft_error,peak_shift_error)
unsigned int *ref;      /* reference image */
unsigned int *mov;      /* moving images shifted data */
int xjump;              /* offset to next array shifted in x */
int yjump;              /* offset to next array shifted in y */
int fullshift;          /* full range of search area */
int windowsize;             /* size of the correlation window */
int *x_shift_error;
int *y_shift_error;
int *peak_shift_error;
{
#ifndef FOO
      register unsigned int val;
#else
      unsigned int val;
      unsigned short *i_ptr;
#endif
      register int i;
      register unsigned int sum;
      register unsigned int small;
      register unsigned int x;
      register unsigned int y;
      register unsigned short *lo;
      register unsigned int *ap;
      register unsigned int *bp;
      register unsigned int *y_shifts;
      unsigned int *x_shifts;
      int xshift;
      int yshift;

bp = mov;
      lo = bitstable;
      x_shifts = shifts;
      small = windowsize * 32;
      for(x = fullshift; --x != -1;) {        /* matching in X */
            y_shifts = x_shifts;
            for(y = fullshift; --y != -1;) {        /* matching in Y */
                  sum = 0;
                  ap = ref;
                  bp = y_shifts;
                  for(i = windowsize; --i != -1;) {  /* matching pixels*/
```

```
                    val = *ap++;
                    val ^= *bp++;
/* 32 exor pixels */
                    i_ptr = (unsigned short int *)&val;
                    sum += lo[*i_ptr++];/* sum matching bits using
                    lookup table */
                    sum += lo[*i_ptr];    /* second byte */
                }
                if(sum < small) {         /* keep track of best match */
                    small = sum;
                    xshift = x;
                    yshift = y;
                }
                y_shifts += yjump;
            }
            x_shifts += xjump;
        }
        *x_shift_error = xshift;
        *y_shift_error = yshift;
        *peak_shift_error = small;
}

/*F
 * MKBITSTABLE           rdb
 * creates lookup table used by the exorsum function
 * this lookup table reflects the number of set bits in a char
 * ie lookup 5, the table should have 2, for two set bits
 */
void mkbitstable()
{
    register int i;
    unsigned short sumbits();
    int j;

bitflag[0] = 0;
    bitflag[1] = 1;
    for(i = 2,j = 1; i < 32; i++) {
        j *= 2;
        bitflag[i] = j;
    }
    for(i = 0; i < 65536; i++) bitstable[i] = sumbits(i);
}
```

```
/*F
 * SUMBITS        rdb
 * returns the number of bits set in an integer
 * this is used to create the lookup table used by exorsum
 */
unsigned short sumbits(i)
int i;          /* integer with bits */
{
     int sum;
     int j;
     sum = 0;
     for(j = 1; j < 17; j++) if(i & bitflag[j]) sum++;
     return(sum);
}
```

I claim:

1. A method of operating a processor to determine offset of a second image relative to a first image, wherein each image is defined by stored pixel data describing a respective plurality of pixels in which each pixel is defined by a location within an x-y grid and an intensity value, comprising the steps of:

a. retrieving from said stored pixel data a set of data describing a first patch (710) comprising nxn pixels from a first image (700);

b. preparing data defining a first Laplacian patch (1010) by convolving intensity values of pixels of the first patch with values of a zero-mean Laplacian kernel (900), the data defining the first Laplacian patch describing a plurality of pixels in which each pixel is defined by a location within an x-y grid and an intensity value having a sign;

c. preparing data defining a first registration image (1810) by convolving intensity values of pixels of the first Laplacian patch with a Gaussian kernel (1200) along two axes of an x-y grid, the Gaussian kernel having a plurality of Gaussian kernel values (e.g., 1, 6, 15, 20) which can be arranged to approximate a Gaussian sequence (e.g., 1, 6, 15, 20, 15, 6, 1), the data defining the first registration image describing a plurality of pixels (e.g., 1720) in which each pixel is defined by a location within an x-y grid and an intensity value having a sign;

d. preparing data defining a first binarized image by converting intensity values of pixels of the first registration image to respective binary values in dependence upon the sign of the intensity value, the data defining the first binarized image describing a plurality of pixel locations within an x-y grid and a binary value for each pixel location;

e. retrieving from said stored pixel data a set of data describing a second patch (810) of mxm pixels from a second image (800), where m is a value less than n;

f. preparing data defining a second Laplacian patch (1110) by convolving intensity values of pixels of the second patch with values of a zero-mean Laplacian kernel (900), the data defining the second Laplacian patch describing a plurality of pixels in which each pixel is defined by a location within an x-y grid and an intensity value having a sign;

g. preparing data defining a second registration image (1910) by convolving intensity values of pixels of the second Laplacian patch with a Gaussian kernel (1200) along two axes of an x-y grid, the Gaussian kernel having a plurality of Gaussian kernel values (e.g., 1, 6, 15, 20) which can be arranged to approximate a Gaussian sequence (e.g., 1, 6, 15, 20, 15, 6, 1), the data defining the second registration image describing a plurality of pixels in which each pixel is defined by a location within an x-y grid and an intensity value having a sign;

h. preparing data defining a second binarized image by converting intensity values of pixels of the second registration image to respective binary values in dependence upon the sign of the intensity value, the data defining the second binarized image describing a plurality of pixel locations within an x-y grid and a binary value for each pixel location;

i. for each of a plurality of possible offset of the second binarized image relative to the first binarized image for which mxm pixels of the second binarized image are aligned with mxm pixels of the first binarized image, (1) performing an EXOR operation for each of mxm pixel locations between the binary value of the binarized first registration image and the binary value of the binarized second registration image to produce a binary pixel-correlation value per pixel location; and (2) determining a sum of the binary pixel-correlation values to obtain an image-correlation value; and j. comparing the image-correlation values to identify an offset of the second binarized image relative to the first binarized image which results in a maximum correlation between the second binarized image and the first binarized image; and k. storing a representation of the identified offset, said stored representation being indicative of offset of the second image relative to the first image.

2. The method of claim 1, wherein the zero-mean Laplacian kernel comprises a center kernel having a first value and four surrounding coefficents each having a second value equal to minus one-fourth the first value, and wherein step b. comprises, for each pixel of the first patch:

(1) multiplying the intensity value by the first value, (2) multiplying the intensity value of each neighboring pixel along x- and y- axes of the grid by the second value, and (3) summing products of multiplication steps b.(1) and b.(2) to produce an intensity value having a sign for each location of the first Laplacian patch.

3. The method of claim 2, wherein the zero-mean Laplacian kernel comprises a center coefficient of four, and four surrounding coefficients of minus one.

4. The method of claim 1, wherein step c. comprises the steps of:

(1) for each Gaussian kernel value, multiplying the intensity values of the first Laplacian patch by the Gaussian kernel value to prepare data defining a respective first multiplier image (e.g., 1400, 1410, 1420, 1430), such that the data defining a first multiplier image for a given Gaussian kernel value describes a plurality of pixels in which each pixel is defined by a location in an x-y grid and an intensity value comprising the product of the given Gaussian kernel value and a corresponding intensity value of the first Laplacian patch;

(2) summing intensity values selected from pixels (e.g., 1525–1560) of said first multiplier images to prepare data defining a first resultant image (1510) such that the first resultant image approximates a convolution of the first Laplacian image with the Gaussian kernel along one of said axes (e.g., the x-axis), the data defining the first resultant image describing a plurality of pixels (e.g., 1520) in which each pixel is defined by a location within an x-y grid and an intensity value;

(3) for each Gaussian kernel value, multiplying the intensity values of the first resultant image by the Gaussian kernel value to prepare data defining a respective second multiplier image (e.g., 1510, 1610, 1620, 1630), such that the data defining a second multiplier image for a given Gaussian kernel value describes a plurality of pixels in which each pixel is defined by a location in an x-y grid and an intensity value comprising the product of the given Gaussian kernel value and a corresponding intensity value of the first resultant image; and (4) summing intensity values selected from pixels (e.g., 1725–1760) of said second multiplier images to prepare the data defining the first registration image (1810)

such that the first registration image approximates a convolution of the first resultant image with the Gaussian kernel along the other of said axes (e.g., the y-axis).

5. The method of claim 4, wherein each pixel of the first Laplacian patch has an intensity value $\vartheta$, and wherein step c.(1) comprises for each pixel of the first Laplacian patch:

(a) storing in a first register a binary number representing the intensity value 0 of the pixel, (b) left-shifting the binary number stored in the first register to produce a binary number representing a value $2\vartheta$ and storing said binary number representing value $2\vartheta$ in a second register, (c) left-shifting the binary number stored in the second register to produce a binary number representing a value $4\vartheta$ and storing said binary number representing value $4\vartheta$ in a third register, (d) left-shifting the binary number stored in the third register to produce a binary number representing a value $16\vartheta$ and storing said binary number representing value $16\vartheta$ in a fourth register, (e) summing the binary numbers stored in said second and third registers to produce a binary number representing a value $6\vartheta$ and storing said binary number representing value $6\vartheta$ in a fifth register, (f) subtracting the binary number stored in said first register from the binary number stored in said fourth register to produce a binary number representing a value $15\vartheta$ and storing said binary number representing value $15\vartheta$ in a sixth register, (g) summing the binary numbers stored in said third and fourth registers to produce a binary number representing a value $20\vartheta$ and storing said binary number representing value $20\vartheta$ in a seventh register, and (h) storing the binary numbers representing values $\vartheta$, $6\vartheta$, $15\vartheta$ and $20\vartheta$ in a data structure, such that, when steps c.i.(a) through c.i.(h) are completed for each pixel of the first Laplacian patch, the data structure contains data describing a first multiplier image for each Gaussian kernel value.

6. The method of claim 1, wherein step c. further comprises storing the data defining the first registration image as a series of $2^P$-bit digital words in which each digital word contains an intensity value of a respective pixel of the first registration image, and wherein step d. further comprises the step of storing said binary values of the data defining the first binarized image as a single $2^P$-bit digital word for each $2^P$ pixels of the first binarized image.

7. The method of claim 6, wherein step g. further comprises storing the data defining the second registration image as a series of $2^P$-bit digital words in which each digital word contains an intensity value of a respective pixel of the second registration image, and wherein step d. further comprises the step of storing said binary values of the data defining the second binarized image as a single $2^P$-bit digital word for each $2^P$ pixels of the second binarized image.

8. The method of claim 7, wherein step i.(1) comprises, for each block of $2^P$ pixel locations, performing an EXOR operation for each of the $2^P$ pixel locations in a single processor instruction to thereby produce a digital matching word representing correlation of the first binarized image and the second binarized image over the $2^P$ pixel locations.

9. The method of claim 8, wherein step i.(2) comprises, for each block of $2^P$ pixel locations, looking up the digital matching word in a stored look-up table in which a sum of binary correlation values of $2^P$ pixel locations is provided for each possible value of the digital matching word to thereby obtain a partial-correlation value representing the sum of binary correlation values for $2^P$ pixel locations.

10. The method of claim 9, wherein step i.(2) further comprises the step of summing partial-correlation values of all of said blocks of $2^P$ pixel locations to obtain said image-correlation value.

11. The method of claim 1, wherein said possible offsets comprise a first plurality of possible offsets along the x-axis and a second plurality of possible offsets along the y-axis, the method further comprising the step of:

preparing from said data defining a first binarized image, for each possible offset along the x-axis, data defining a strip of nxm pixel locations of the first binarized image, and wherein step i.(1) comprises, for each said strip of nxm pixel locations of the first binarized image and for each possible offset along the y-axis, performing an EXOR operation for each of nxn pixel locations between the binary value of the first binarized image and the binary value of the second binarized image.

12. The method of claim 1, wherein said second image comprises a CAD layout image of an IC and said first image comprises a SEM image of an IC, and wherein step g. further comprises preparing data defining a second registration image by convolving intensity values of pixels of the second Laplacian patch with a plurality of Gaussian kernels.

13. The method of claim 1, wherein said first image comprises a layout image of an IC and said second image comprises a SEM image of an IC device, the method further comprising the steps of selecting from said first image a first x-y coordinate representing a selected location of said IC device at which a probe beam is to be placed, preparing a second x-y coordinate shifted from said first x-y coordinate by said identified offset, and aiming an electron-beam at the IC device in a direction corresponding to said second x-y coordinate.

14. The method of claim 13, further comprising the steps of: detecting secondary electrons emitted from the IC as the electron beam is aimed at said IC device during a first time interval to thereby acquire a first portion of a waveform appearing at the selected location of the IC device, acquiring an updated SEM image of the IC, replacing said second image with said updated SEM image, repeating steps a. through k. to identify an updated offset, preparing an updated second x-y coordinate shifted from said first x-y coordinate by said updated offset, aiming the electron-beam during a second time interval at the IC device in a direction corresponding to the updated second x-y coordinate, and detecting secondary electrons emitted from the IC as the electron beam is aimed at said IC device during the second time interval to thereby acquire a second portion of a waveform appearing at the selected location of the IC device.

15. The method of claim 1, wherein said first image comprises a SEM reference image of a first stack of images representing correct operation of an IC device and said second image comprises a SEM reference image of a second stack of images representing failing operation of an IC device and each image of the second stack corresponds to an image of the first stack, the method further comprising the steps of shifting each image of the second stack relative to the corresponding image of the first stack by an amount equal to the identified offset and, for each image of the first stack, preparing a difference image by taking the difference between the intensity values of pixels of image of the first stack and the intensity values of pixels of the shifted image of the second stack.

16. The method of claim 1, wherein said first image comprises a SIM image of a first IC device and said second image comprises a SIM image of a second IC device, the method further comprising the steps of selecting from said first image a first x-y coordinate representing a location of said second IC device at which a FIB is to be directed, preparing a second x-y coordinate shifted from said first x-y coordinate by said identified offset, and aiming a FIB at the second IC device in a direction corresponding to said second x-y coordinate.

17. Apparatus for determining offset of a second image relative to a first image, comprising:

a. means for storing the first image (700) and the second image (800) as pixel data describing a respective plurality of pixels in which each pixel is defined by a location within an x-y grid and an intensity value;

b. means for retrieving from said storing means a set of data describing a first patch (710) comprising nxn pixels of the first image;

c. means for preparing data defining a first Laplacian patch (1010) by convolving intensity values of pixels of the first patch with values of a zero-mean Laplacian kernel (900), the data defining the first Laplacian patch describing a plurality of pixels in which each pixel is defined by a location within an x-y grid and an intensity value having a sign;

d. means for preparing data defining a first registration image (1810) by convolving intensity values of pixels of the first Laplacian patch with a Gaussian kernel (1200) along two axes of an x-y grid, the Gaussian kernel having a plurality of Gaussian kernel values (e.g., 1, 6, 15, 20) which can be arranged to approximate a Gaussian sequence (e.g., 1, 6, 15, 20, 15, 6, 1), the data defining the first registration image describing a plurality of pixels (e.g., 1720) in which each pixel is defined by a location within an x-y grid and an intensity value having a sign;

e. means for preparing data defining a first binarized image by converting intensity values of pixels of the first registration image to respective binary values in dependence upon the sign of the intensity value, the data defining the first binarized image describing a plurality of pixel locations within an x-y grid and a binary value for each pixel location;

f. means for retrieving from said stored pixel data a set of data describing a second patch (810) of mxm pixels from the second image, where m is a value less than n;

g. means for preparing data defining a second Laplacian patch (1110) by convolving intensity values of pixels of the second patch with values of a zero-mean Laplacian kernel (900), the data defining the second Laplacian patch describing a plurality of pixels in which each pixel is defined by a location within an x-y grid and an intensity value having a sign;

h. means for preparing data defining a second registration image (1910) by convolving intensity values of pixels of the second Laplacian patch with a Gaussian kernel (1200) along two axes of an x-y grid, the Gaussian kernel having a plurality of Gaussian kernel values (e.g., 1, 6, 15, 20) which can be arranged to approximate a Gaussian sequence (e.g., 1, 6, 15, 20, 15, 6, 1), the data defining the second registration image describing a plurality of pixels in which each pixel is defined by a location within an x-y grid and an intensity value having a sign;

i. means for preparing data defining a second binarized image by converting intensity values of pixels of the second registration image to respective binary values in dependence upon the sign of the intensity value, the data defining the second binarized image describing a plurality of pixel locations within an x-y grid and a binary value for each pixel location;

j. means for performing, for each of a plurality of possible offsets of the second binarized image relative to the first binarized image for which mxm pixels of the second binarized image are aligned with mxm pixels of the first binarized image, an EXOR operation for each of mxm pixel locations between the binary value of the binarized first registration image and the binary value of the binarized second registration image to produce a binary pixel-correlation value per pixel location;

k. means for determining, for each of the possible offsets of the second binarized image relative to the first binarized image for which mxm pixels of the second binarized image are aligned with mxm pixels of the first binarized image, a sum of the binary pixel-correlation values to obtain an image-correlation value;

l. means for comparing the image-correlation values to identify an offset of the second binarized image relative to the first binarized image which results in a maximum correlation between the second binarized image and the first binarized image; and m. means for storing a representation of the identified offset, said stored representation being indicative of offset of the second image relative to the first image.

18. A method of modifying an IC device, comprising the steps of: a. acquiring a first SIM image of an IC device at a selected field of view;

b. storing the first image as a plurality of pixels, each pixel defined by a location within an x-y grid and an intensity value;

b. storing first coordinates defining the selected field of view;

c. storing operating parameters defining a FIB operation to be carried out on an IC device at a selected location within the selected field of view;

d. retrieving a first patch comprising of nxn pixels of the first image;

e. preparing a first Laplacian patch by convolving intensity values of pixels of the first patch with values of a zero-mean Laplacian kernel, the first Laplacian patch comprising a plurality of pixels in which each pixel is defined by a location within an x-y grid and an intensity value having a sign;

f. preparing a first registration image by convolving intensity values of pixels of the first Laplacian patch with a Gaussian kernel along two axes of an x-y grid, the first registration image describing a plurality of pixels in which each pixel is defined by a location within an x-y grid and an intensity value having a sign;

g. preparing a first binarized image by converting intensity values of pixels of the first registration image to respective binary values in dependence upon the sign of the intensity value, the data defining the first binarized image describing a plurality of pixel locations within an x-y grid and a binary value for each pixel location;

h. acquiring a second SIM image of an IC device to be modified at approximately the selected field of view; selecting a second patch comprising mxm pixels of the second image;

i. preparing a second Laplacian patch by convolving intensity values of j. pixels of the second patch with values of a zero-mean Laplacian kernel, the second Laplacian patch comprising a plurality of pixels in which each pixel is defined by a location within an x-y grid and an intensity value having a sign;

k. preparing a second registration image by convolving intensity values of pixels of the second Laplacian patch with a Gaussian kernel along two axes of an x-y grid, the second registration image comprising a plurality of pixels in which each pixel is defined by a location within an x-y grid and an intensity value having a sign;

l. preparing a second binarized image by converting intensity values of pixels of the second registration image to respective binary values in dependence upon the sign of the intensity value, the first binarized image comprising a plurality of pixel locations within an x-y grid and a binary value for each pixel location;

m. for each of a plurality of possible offset of the second binarized image relative to the first binarized image for which mxm pixels of the second binarized image are aligned with mxm pixels of the first binarized image, (1) performing an EXOR operation for each of mxm pixel locations between the binary value of the binarized first registration image and the binary value of the binarized second registration image to produce a binary pixel-correlation value per pixel location; and (2) determining a sum of the binary pixel-correlation values to obtain an image-correlation value;

n. comparing the image-correlation values to identify an offset of the second binarized image relative to the first binarized image which results in a maximum correlation between the second binarized image and the first binarized image;

o. preparing corrected operating parameters by correcting the stored operating parameters in accordance with the identified offset; and p. carrying out the FIB operation defined by the corrected operating parameters.

* * * * *